United States Patent
Popiolkowski et al.

(10) Patent No.: US 6,812,471 B2
(45) Date of Patent: Nov. 2, 2004

(54) METHOD OF SURFACE TEXTURIZING

(75) Inventors: Alan R Popiolkowski, Los Banos, CA (US); Shannon M. Hart, Campbell, CA (US); Marc O. Schweitzer, San Jose, CA (US); Alan B. Liu, Mountain View, CA (US); Jennifer L. Watia, Mountain View, CA (US); Brian West, San Jose, CA (US); Mark Menzie, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/622,178

(22) Filed: Jul. 17, 2003

(65) Prior Publication Data

US 2004/0056211 A1 Mar. 25, 2004

Related U.S. Application Data

(63) Continuation-in-part of application No. 10/099,307, filed on Mar. 13, 2002.
(60) Provisional application No. 60/479,755, filed on Jun. 18, 2003.

(51) Int. Cl.[7] .............................. G00F 7/20; H01L 21/00
(52) U.S. Cl. ................................................... 250/492.1
(58) Field of Search ...................... 250/492.1, 396 ML, 250/307, 310, 311

(56) References Cited

U.S. PATENT DOCUMENTS

| | | |
|---|---|---|
| 3,514,391 A | 5/1970 | Hablanian et al. |
| 4,724,060 A | 2/1988 | Sakata et al. |
| 5,064,698 A | 11/1991 | Courtright et al. |
| 5,135,629 A | 8/1992 | Sawada et al. |
| 5,151,571 A | 9/1992 | Sanderson et al. |

(List continued on next page.)

FOREIGN PATENT DOCUMENTS

| | | |
|---|---|---|
| EP | 0 167 360 | 1/1986 |
| WO | WO 98/31845 A1 | 7/1998 |
| WO | WO 01/40540 A1 | 6/2001 |
| WO | WO 02/094497 A3 | 11/2002 |
| WO | WO 02/094497 A2 | 11/2002 |

OTHER PUBLICATIONS

PCT International Search Report for File Reference No. APPM/6162PCT; International Application No. PCT/US 03/05781, International Filing Date Feb. 24, 2003 (4 sheets).
Dance EP Pub. No. 0626228 A1, Nov. 1994.

*Primary Examiner*—John R. Lee
*Assistant Examiner*—James J. Lebourne
(74) *Attorney, Agent, or Firm*—Moser Patterson & Sheridan

(57) ABSTRACT

A method and system for providing a texture to a surface of a workpiece, such as a chamber component is provided. The method comprises providing a workpiece to a texturizing chamber and scanning a beam of electromagnetic energy across the surface of the workpiece to form a plurality of features thereon. The features formed are generally depressions, protuberances, and combinations thereof. The chamber components may include, for example, a chamber shield and related assembly, a target, a shadow ring, a contact ring, a substrate support or other component disposable within a processing chamber. Also provided is a method of reducing contamination in a process chamber. The method comprises scanning a beam of electromagnetic energy across a surface of one or more process chamber components to form a plurality of features thereon, positioning the one or more chamber components into a process chamber, and initiating a process sequence within the process chamber.

46 Claims, 13 Drawing Sheets

U.S. PATENT DOCUMENTS

| | | |
|---|---|---|
| 5,209,813 A | 5/1993 | Oshida et al. |
| 5,401,319 A * | 3/1995 | Banholzer et al. .............. 134/1 |
| 5,459,297 A | 10/1995 | Boppel et al. |
| 5,474,649 A * | 12/1995 | Kava et al. ................. 438/729 |
| 5,614,071 A | 3/1997 | Mahvan et al. |
| 5,632,869 A | 5/1997 | Hurwitt et al. |
| 5,656,093 A | 8/1997 | Burkhart et al. |
| 5,711,813 A | 1/1998 | Kadoiwa et al. |
| 5,804,046 A | 9/1998 | Sawada et al. |
| 5,830,330 A | 11/1998 | Lantsman |
| 5,837,057 A | 11/1998 | Koyama et al. |
| 5,838,016 A | 11/1998 | Johnson |
| 6,162,297 A | 12/2000 | Mintz et al. |
| 6,288,406 B1 | 9/2001 | Penberth et al. |
| 6,319,419 B1 | 11/2001 | Ohhashi et al. |
| 6,506,254 B1 | 1/2003 | Bosch et al. |
| 6,670,571 B2 * | 12/2003 | Dance ................... 219/121.18 |
| 2002/0006766 A1 * | 1/2002 | Haerle et al. ................. 451/39 |
| 2003/0006217 A1 | 1/2003 | Dance |
| 2003/0047464 A1 | 3/2003 | Sun et al. |

* cited by examiner

METHOD OF SURFACE TEXTURIZING

CROSS-REFERENCE TO RELATED APPLICATIONS

This application claims priority to U.S. Provisional Patent Application Ser. No. 60/479,755, filed Jun. 18, 2003, entitled "Method of Surface Texturizing,", which application is herein incorporated by reference. This application is also a continuation-in-part of co-pending U.S. patent application Ser. No. 10/099,307, filed Mar. 13, 2002, entitled "Method of Surface Texturizing," and is herein incorporated by reference.

BACKGROUND OF THE INVENTION

1. Field of the Invention

Embodiments of the present invention generally relate to using a beam of electromagnetic radiation to modify the surface of a material. More particularly, embodiments of the present invention relate to a method of using an electron beam to modify the surface of components used in a process chamber to provide a textured surface on chamber components.

2. Description of the Related Art

As integrated circuit devices continue to be fabricated with reduced dimensions, the manufacture of these devices become more susceptible to reduced yields due to contamination. Consequently, fabricating integrated circuit devices, particularly those having smaller physical sizes, requires that contamination be controlled to a greater extent than previously considered to be necessary.

Contamination of integrated circuit devices may arise from sources such as undesirable stray particles impinging on a substrate during thin film deposition, etching or other semiconductor fabrication processes. In general, the manufacturing of the integrated circuit devices includes the use of such chambers as physical vapor deposition (PVD) and sputtering chambers, chemical vapor deposition (CVD) chambers, plasma etching chambers, etc. During the course of deposition and etch processes, materials often condense from the gas phase onto various internal surfaces in the chamber to form solid masses that reside on these surfaces of the chamber. This condensed foreign matter accumulates on the internal surfaces of the chamber and is prone to detaching or flaking off from the internal surfaces in between or during a wafer process sequence. This detached foreign matter may then impinge upon and contaminate the wafer substrate and devices thereon. Contaminated devices frequently must be discarded, thereby decreasing the manufacturing yield of the process.

In order to prevent detachment of foreign matter that has condensed on internal surfaces of the process chamber, internal surfaces may be textured such that the condensed foreign matter that forms on these surfaces has enhanced adhesion to the surface and is less likely to detach and contaminate a wafer substrate. Methods currently used to texture chamber surfaces include "bead blasting." Bead blasting includes spraying hard particles onto the surface in order to affect a roughening of the surface. Alternatively, the surface may be texturized by applying a coating, such as a thin coating of aluminum deposited by an aluminum arc spray, to the surface. However, these and other commonly used methods for modifying the surfaces within a process chamber are sometimes ineffective at creating sufficient adhesion between the condensed masses and the chamber surface.

In order to circumvent the problems associated with detached foreign matter, chamber surfaces require frequent, and sometimes lengthy cleaning steps to remove condensed masses from the chamber surfaces. Also, despite the amount of cleaning that is performed, in some instances, contamination from detached foreign matter may still occur.

Therefore, there is a need to reduce contamination from foreign matter that has condensed on interior surfaces of a process chamber and a need to develop a method for improving the adhesion of condensed foreign matter onto the interior surfaces of a process chamber.

SUMMARY OF THE INVENTION

The present invention generally provides a method of providing a texture to a surface of a workpiece. The method comprises providing a workpiece to a texturizing chamber and scanning a beam of electromagnetic energy across the surface of the workpiece to form a plurality of features thereon. The features that are formed are selected from the group consisting of depressions, protuberances, and combinations thereof.

The present invention generally provides a method of providing a texture to a surface of a workpiece. The method comprises providing a workpiece to a texturizing chamber and scanning an electron beam across the surface of the workpiece to form a plurality of features thereon. The features that are formed are selected from the group consisting of depressions, protuberances, and combinations thereof.

Also provided is a method of reducing contamination in a process chamber. The method comprises scanning a beam of electromagnetic energy across a surface of one or more process chamber components to form a plurality of features thereon. The features that are formed are selected from the group consisting of depressions, protuberances, and combinations thereof. The method further comprises positioning the one or more chamber components into a process chamber and initiating a process sequence within the process chamber.

BRIEF DESCRIPTION OF THE DRAWINGS

So that the manner in which the above-recited features, advantages and objects of the present invention are attained can be understood in detail, a more particular description of the invention, briefly summarized above, may be had by reference to the embodiments thereof which are illustrated in the appended drawings.

DETAILED DESCRIPTION OF THE PREFERRED EMBODIMENT

Figure 1:
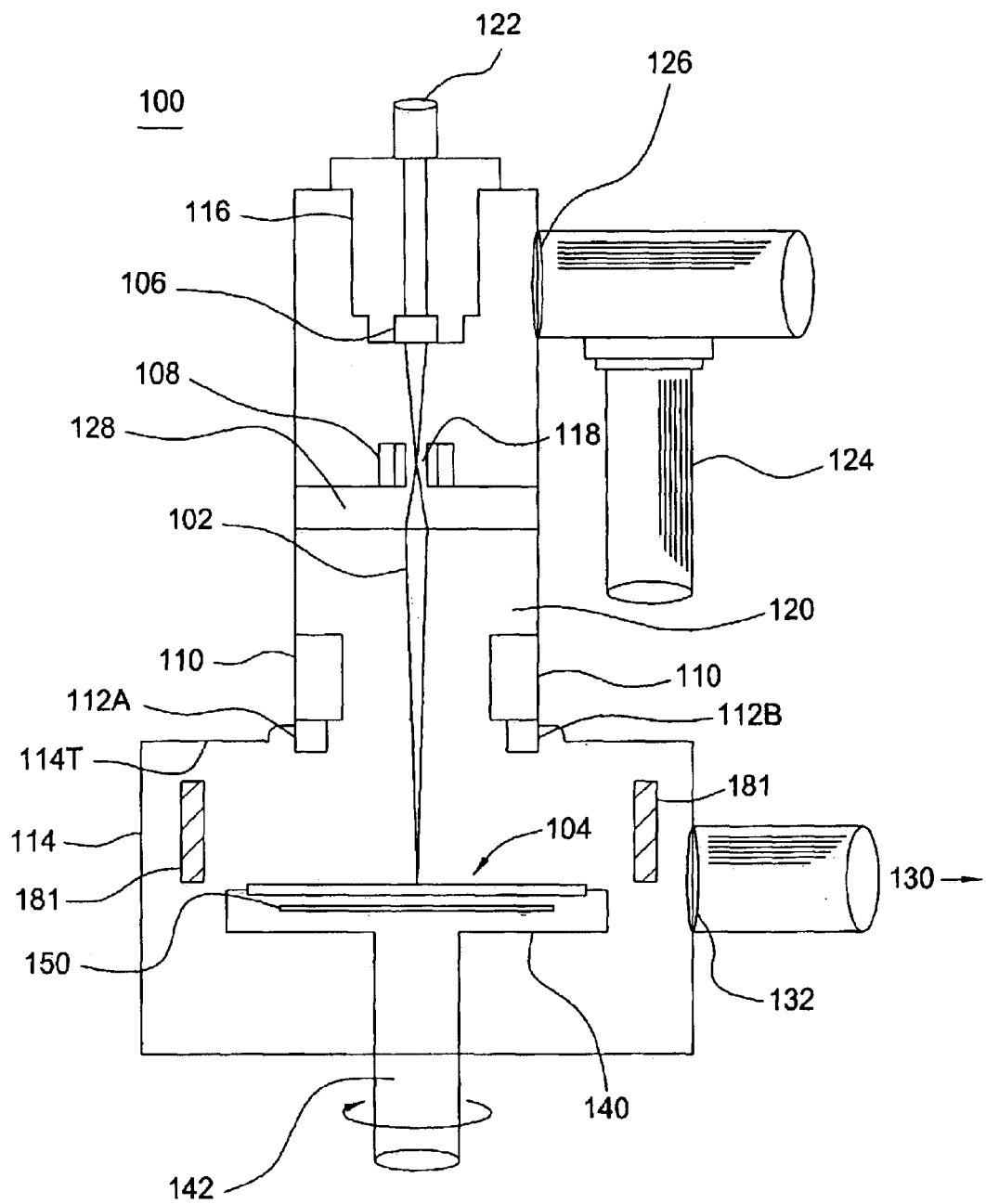
FIG. 1 depicts a schematic, cross-sectional illustration of a surface texturizing apparatus that may be used to practice embodiments described herein.

FIG. 1 depicts a cross-sectional, schematic view of surface texturizing apparatus 100 that may be used to modify the surface of a workpiece 104. Surface texturizing apparatus 100 generally comprises a column 120. Located within the column is a bias cup 116 surrounding a cathode 106. The cathode 106 may be, for example, a filament comprising a material such as tungsten. A high voltage cable 122 is coupled to the cathode 106 which connects a high voltage power supply to the cathode 106 and the anode 108.

Spaced apart from the cathode 106 and beneath the cathode 106 is an anode 108, and two pairs of high speed deflector coils 112a, 112b. A pass through hole 118 is formed within the anode 108. A fast focusing coil 110, typically circular in design and concentric with the column 120 is located beneath anode 108. The two pairs of high speed deflector coils 112a, 112b reside beneath the fast focusing coil 110. Coupled to, and below column 120 is a work chamber 114 with a top surface 114t. The work chamber 114 generally comprises a substrate support 140. The substrate support 140 may be coupled to an actuating means 142 for moving the substrate support 140, such as, for example, an actuator or rotating shaft that is capable of translating the workpiece 104 or rotating the workpiece 104 along one or more axes of rotation. Actuating means 142 moves the substrate relative to an electromagnetic beam 102. Electromagnetic beam 102 may be, for example, an electron beam. The substrate support 140 may further comprise a heating element 150, such as, for example, a resistive heater or thermoelectric device. An isolation valve 128 positioned between anode 108 and fast focusing coil 110 generally divides column 120, so that chamber 114 may be maintained at a pressure different from the portion of column 120 above the isolation valve 128.

A pump 124 such as, for example, a diffusion pump or a turbomolecular pump is coupled to column 120 via a valve 126. Pump 124 is used to evacuate column 120. Typically, a vacuum pump 130 is coupled to chamber 114 via an isolation valve 132 in order to evacuate chamber 114. Examples of e-beam devices which can be used or modified and used in processes described herein include electron beam welding systems from Precision Technologies of Enfield, Conn. or from Cambridge Vacuum Engineering of Waterbeach, Cabs, United Kingdom.

While FIG. 1 specifically depicts a surface texturizing apparatus comprising an electron beam, it is within the scope of the invention to use any beam of electromagnetic waves or particles, such as, for example, a beam of protons, neutrons, X-rays, a laser, electrical arc, etc. Also the use of the term electromagnetic beam is not meant to be limited to charged particle beams, but is meant to encompass any form of focused energy transferred to the workpiece, for example, an electron beam, a beam of proton or neutrons, X-rays, high intensity optical radiation (e.g. laser), or electrical arc type process (e.g. Electrical Discharge Machining (EDM), etc.). The surface texturizing apparatus generally comprises a means for controlling and focusing the particular beam of energy onto the surface of the workpiece. The particular means employed to control and focus the beam generally depends upon the particular type of electromagnetic radiation employed.

Surface Texturizing Process

Figure 3A:
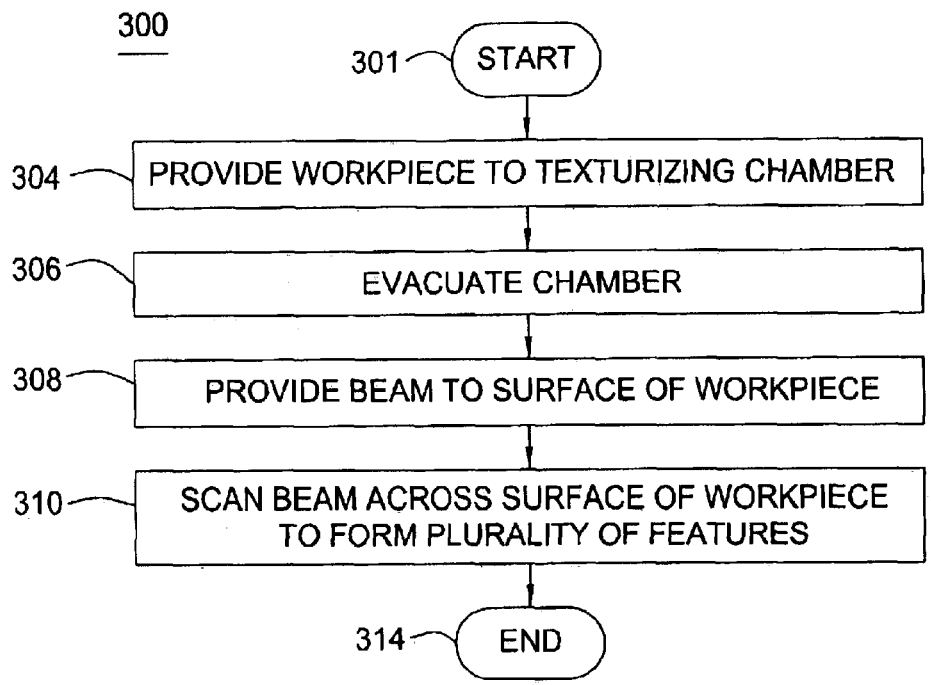
FIG. 3A depicts a series of method steps that may be used to modify a surface of a material using embodiments described herein.
Figure 3B:
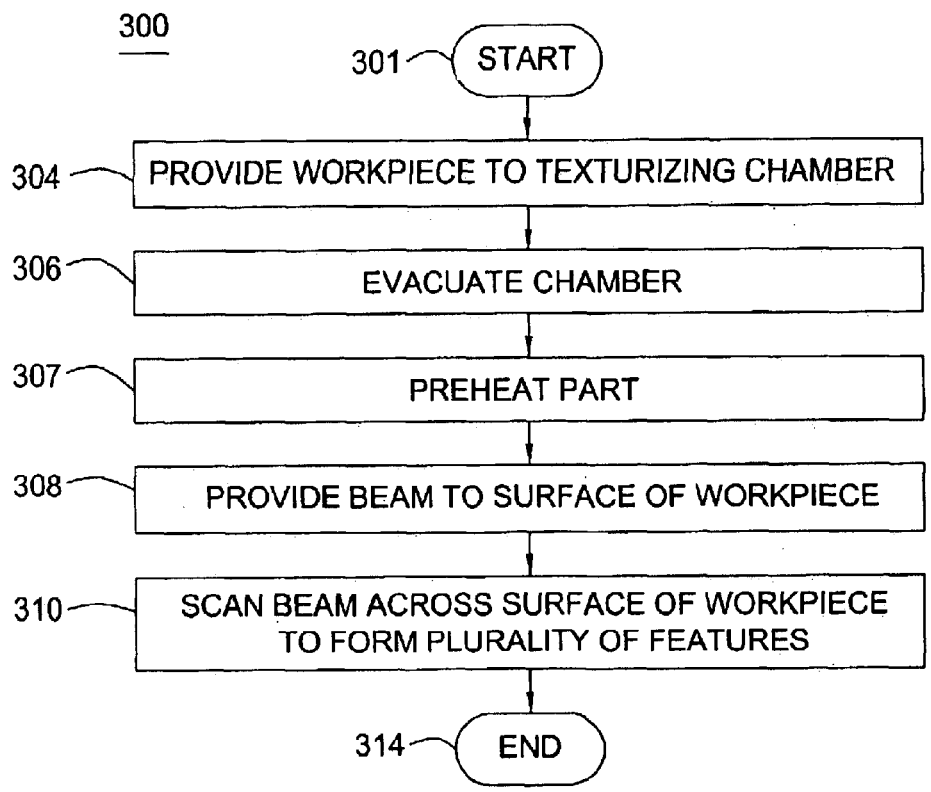
FIG. 3B depicts a series of method steps that may be used to modify a surface of a material using embodiments described herein.
Figure 3C:
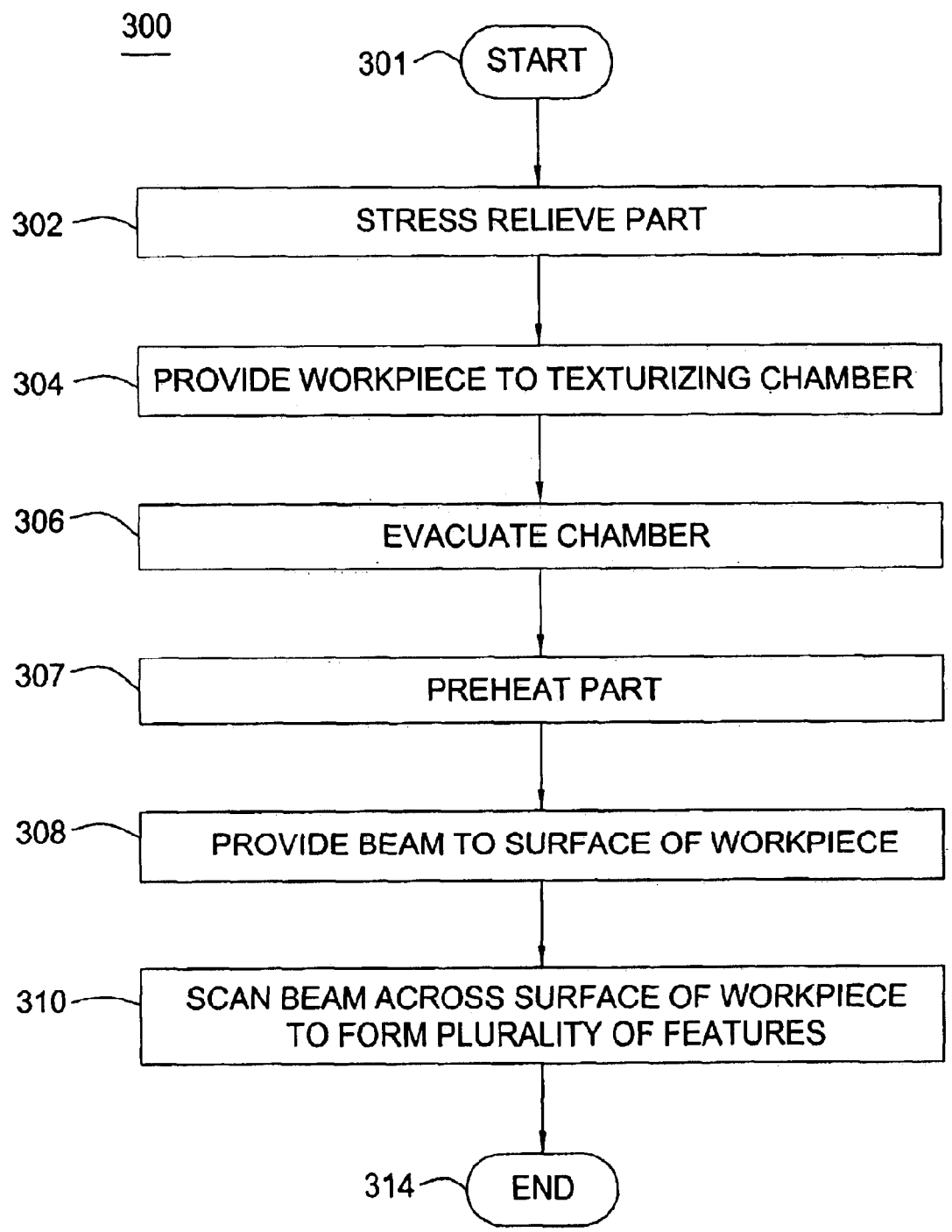
FIG. 3C depicts a series of method steps that may be used to modify a surface of a material using embodiments described herein.
Figure 3D:
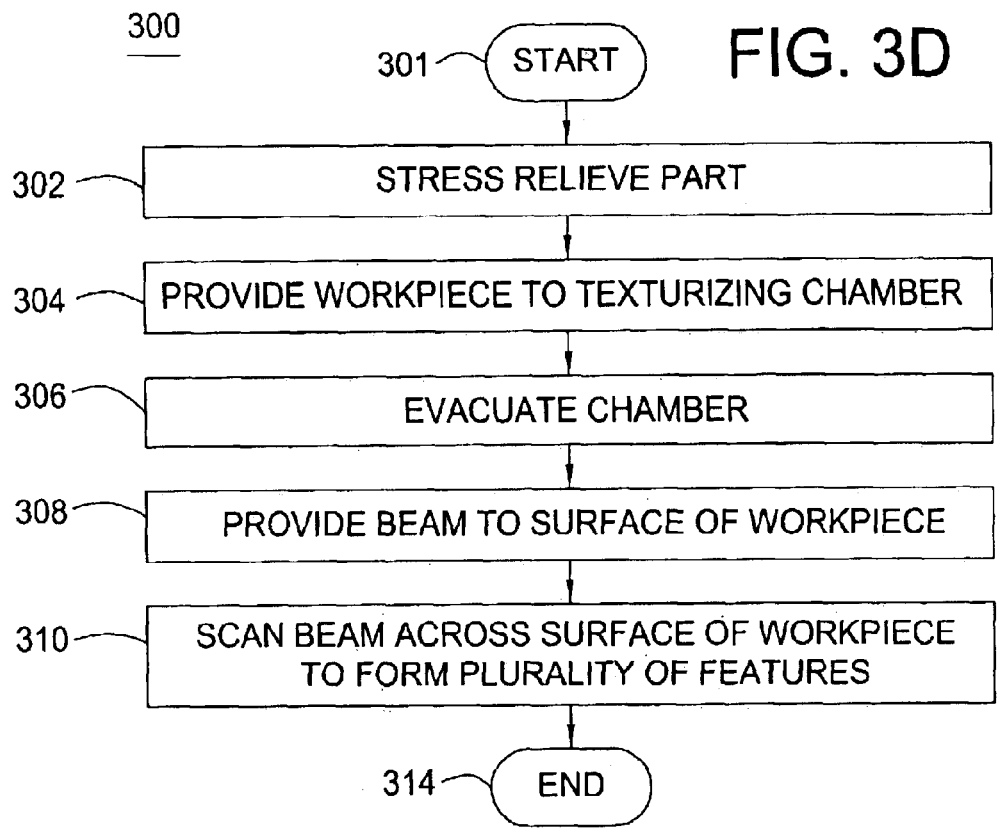
FIG. 3D depicts a series of method steps that may be used to modify a surface of a material using embodiments described herein.
Figure 3E:
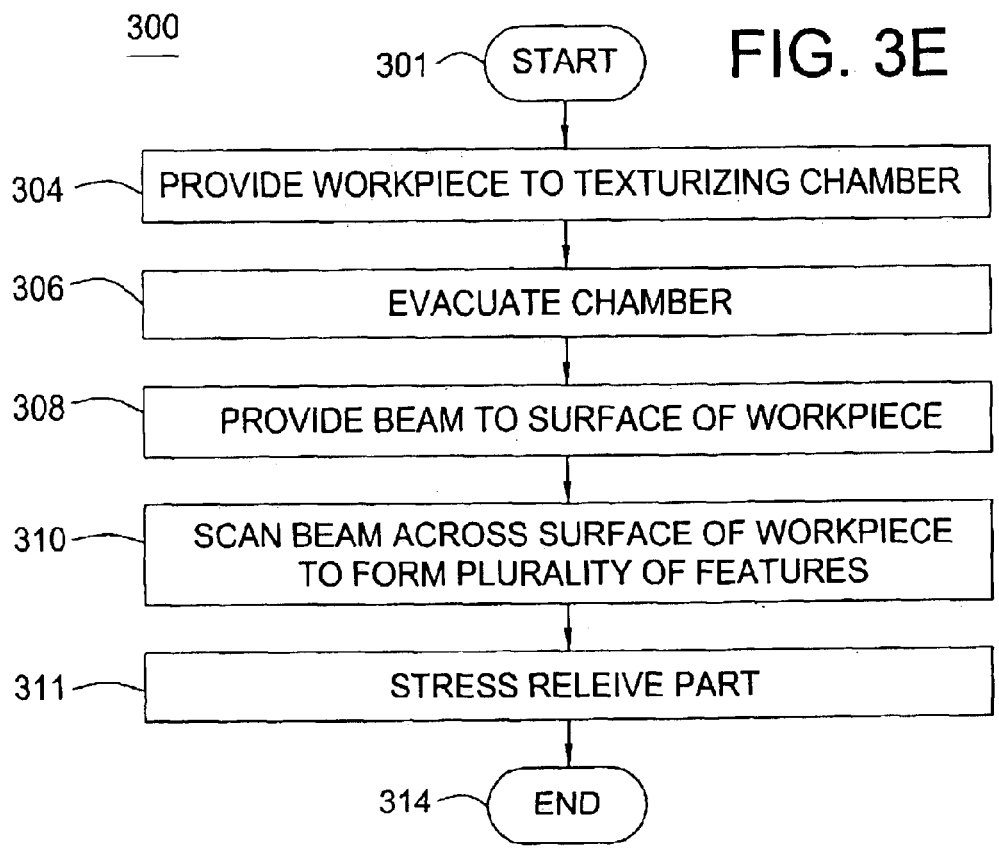
FIG. 3E depicts a series of method steps that may be used to modify a surface of a material using embodiments described herein.
Figure 3F:
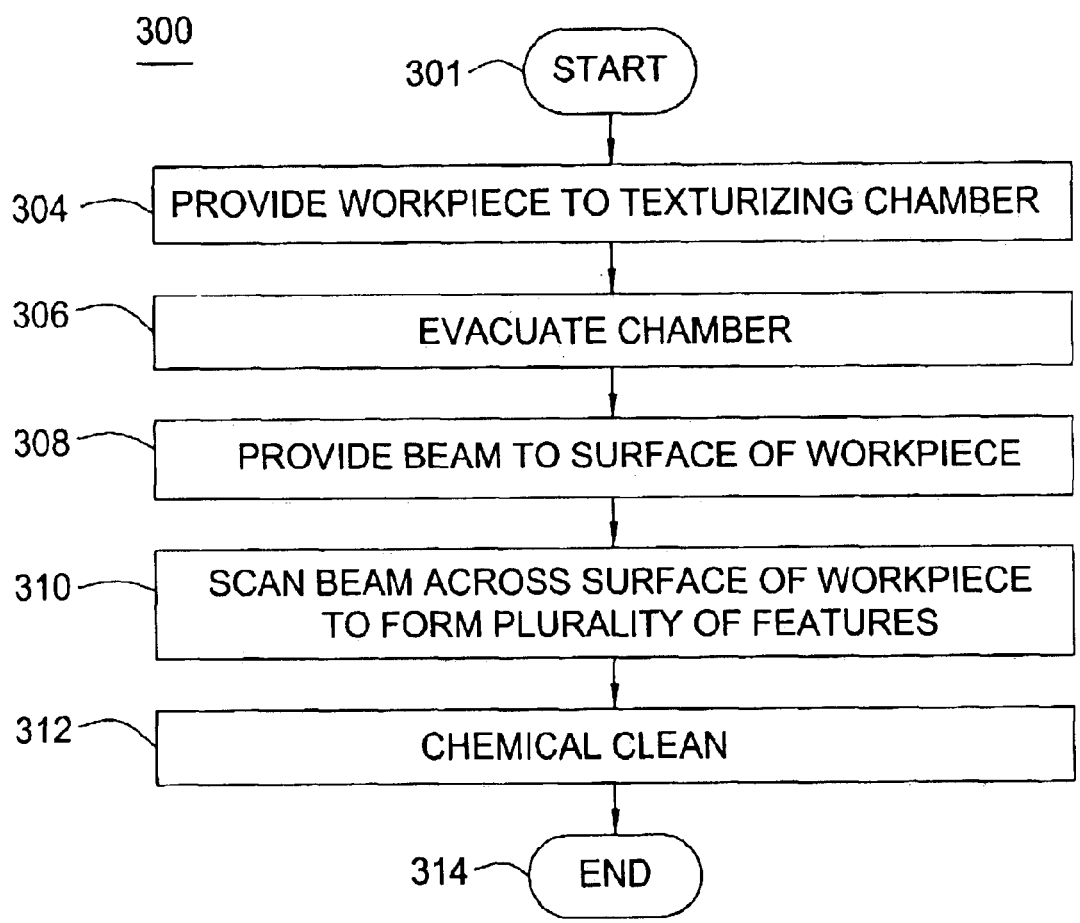
FIG. 3F depicts a series of method steps that may be Used to modify a surface of a material using embodiments described herein.

Various methods for providing a texture to the surface of a workpiece 104 is depicted in FIGS. 3A, 3B, 3C, 3D, 3E and 3F. Specifically, FIG. 3A describes a series of method steps 300 which begins at step 301 and proceeds to step 304 wherein a workpiece 104 is provided to a surface texturizing chamber, such as chamber 114 of FIG. 1. FIG. 3B describes a process 300 as in FIG. 3A but adds a step 307 wherein a workpiece 104 is preheated prior to under going the texturizing process. FIG. 3C describes a series of method steps 300 as in FIG. 3A but adds a step 302 wherein a workpiece 104 is stress relieved prior to step 304, and a step 307 wherein the workpiece is preheated prior under going the texturizing process. FIG. 3D describes a series of method steps 300 as in FIG. 3A but adds a step 302 wherein a workpiece 104 is stress relieved prior to step 304. The preheat step and the stress relief step can be preformed in a separate chamber or the same chamber as the texturizing process. FIG. 3E describes a series of method steps 300 as in FIG. 3A but adds a step 311 wherein the workpiece is stress relieved after the texturizing process is completed in step 310 to relieve any stresses created during or remaining after the texturizing process. In other embodiments of the present invention step 311 may also be added to the other method steps 300 as described in FIGS. 3B, 3C, 3D and 3F to relieve residual stresses induced in the workpiece by the application of texturizing process or to remove the remaining stresses in the workpiece. FIG. 3F describes a series of method steps 300 as in FIG. 3A but adds a step 312 wherein the workpiece is chemically cleaned after the texturizing process is completed in step 310 to reduce or prevent contamination from affecting future processes and improve adhesion of a second material to the workpiece. In other embodiments of the present invention step 312 may also be added to the other method steps 300 as described in FIGS. 3B, 3C, 3D and 3E to reduce or prevent contamination from affecting the future processes in which the workpiece will be used and improve adhesion of a second material to the workpiece.

The workpiece generally comprises a material such as a metal or metal alloy, a ceramic material, a polymer material, a composite material, or combinations thereof. In one embodiment, the workpiece comprises a material selected from the group consisting of steel, stainless steel, tantalum, tungsten, titanium, copper, aluminum, nickel, aluminum oxide, aluminum nitride, silicon oxide, silicon carbide, sapphire ($Al_2O_3$), and combinations thereof. In one embodiment, the workpiece comprises metal alloys such as austenitic-type stainless steels, iron-nickel-chromium alloys (e.g., Inconel® alloys), nickel-chromium-molybdenum-tungsten alloys (e.g., Hastelloy®), copper zinc alloys, chromium copper alloys (e.g., 5% or 10% Cr with balance Cu), or the like. In another embodiment, the workpiece comprises quartz. The workpiece may also comprise polymers such as Polyimide (Vespel®), PolyEtherEtherKetone, PolyArylate (Ardel®), and the like.

Referring to step 306, chamber 114 and column 120 are evacuated to a pressure in the range of about $1\times10^{-3}$ to $1\times10^{-5}$ torr. In one embodiment, an electromagnetic beam 102 is formed by heating cathode 106 using a resistive heater (not shown) and applying a current to the cathode using a power source (not shown). Electrons escape from the cathode and collect in the bias cup 116. A negative high voltage potential, referred to as an accelerating voltage is applied to the cathode 106 relative to the anode 108 via cable 122 and a secondary negative potential generally smaller in magnitude than the accelerating voltage is applied to the bias cup. The accelerating voltage may be in the range of about 50 to about 160 kV. The secondary potential is used to control the magnitude of electron beam energy that is delivered to the workpiece 104.

Electrons move through a pass through hole 118 in the anode and begin to diverge. Fast focusing coil 110 located beneath the anode 108 focuses the electron beam to a narrow diameter on the workpiece 104, while high speed deflector coils 112a, 112b magnetically deflect the beam to a particular location of the surface of workpiece 104. Electrical current is applied to the fast focusing coil 110 and to high speed deflector coils 112a, 112b in order to generate sufficient magnetic flux to manipulate the electromagnetic beam 102. Upon passing through fast focusing coil 110 and high speed deflector coils 112a, 112b, the electron beam is provided to the surface of the workpiece, as indicated in step 308 of FIG. 3. The distance between the top surface 114t of chamber 114 and the workpiece 104 is the working distance of the beam. In one embodiment, the working distance is about 50 millimeters to about 1000 millimeters, preferably about 200 millimeters to about 350 millimeters.

Figure 2:
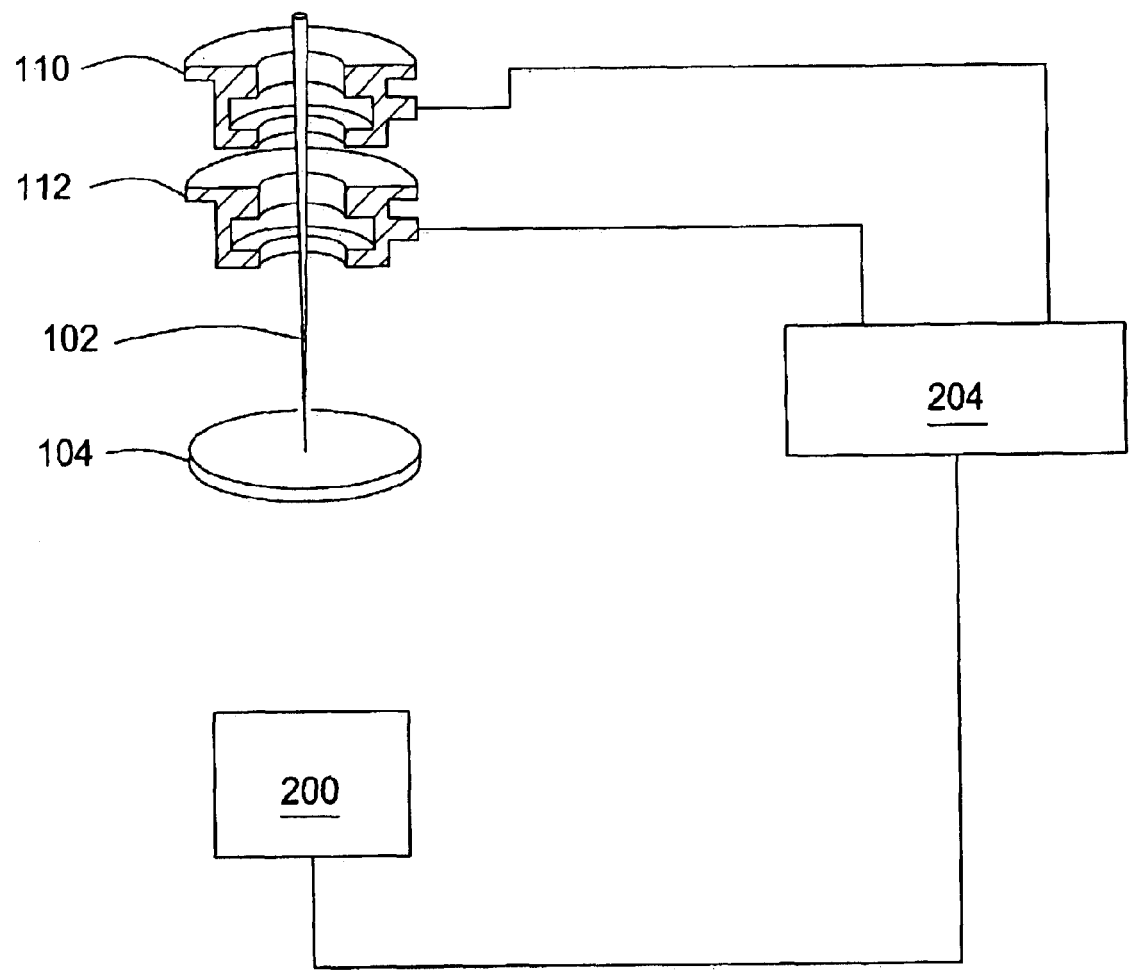
FIG. 2 depicts a schematic, cross-sectional view of a control system that may be coupled to a surface texturizing apparatus to practice embodiments described herein.

Referring to FIG. 2, a microprocessor controller 200 is preferably coupled to focusing coil 110 and high speed deflector coils 112a, 112b. The microprocessor controller 200 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed upon positioning the workpiece 104 in chamber 114. The software routine, when executed, transforms the general purpose computer into a specific process computer that controls the chamber operation so that a chamber process is performed. Alternatively, the process of the present invention may be performed in hardware, as an application specific integrated circuit or other type of hardware implementation, or a combination of software and hardware.

Referring again to FIG. 2, typically a set of instructions is encoded onto a computer readable medium which is provided to controller 200. Control signals produced by executing the instructions are communicated to fast focusing coil 110 and high speed deflector coils 112a, 112b from controller 202 through one or more function generators 204. In one embodiment, instructions are communicated through five function generators 204. One of the five function generators is used for fast focusing. Two function generators are used for primary beam deflections and two function generators are used for secondary beam deflections. The function generators are accompanied by corresponding power amplifiers (not shown). The instructions typically enable the fast focusing coil 110 and high speed deflector coils 112a, 112b to manipulate the electromagnetic beam 102 by moving the beam to a particular location on the surface of the workpiece to create a specific pattern, spacing, and character of features onto the surface of the workpiece 104.

The function generators 204 are capable of generating signal wave shapes over various frequencies. This enables the position and focal diameter of electron beam 104 to adjust rapidly to signals originating from controller 200 and enable the rapid formation of features on the surface of the workpiece. The function generators 204 are preferably coupled to one or more power amplifiers, power supplies, etc. (not shown) in order to facilitate communication of signals between the controller 200 and the focusing coil 110 as well as high speed deflector coils 112a, 112b.

As indicated in step 310 of FIG. 3, the electromagnetic beam 102 is scanned across the surface of the workpiece 104. Workpiece 104 may be heated prior to scanning the beam across a surface of the workpiece 104 to a pre-heat temperature. The pre-heat temperature is generally dependent upon the materials the workpiece 104 is constructed from. For example, workpiece 104 may be heated to a pre-heat temperature less than the temperature at which workpiece 104 begins to melt, undergo a change in physical state or undergo substantial decomposition. Workpiece 104 may be heated using, for example, heating element 150 shown in FIG. 1. The workpiece may also be heated by scanning the component with the electron beam prior to texturizing the workpiece. This preliminary scanning step can be conducted by rapidly transferring the electron beam over the surface in a pattern which heats the area in which the texturizing process is about to be conducted. In one embodiment, the electron beam, or other energy source, process parameters, such as focal length and process, power, are varied during, the process of preheating the workpiece. The process parameters used during the preheat process may depend on the desired preheat temperature, the speed that the beam is transferred across the surface of the workpiece, and/or the workpiece material which is being preheated prior to being texturized.

In one embodiment, the process of preheating the workpiece prior to performing the texturizing process may be accomplished by use of an energy source 181 that is mounted near the workpiece 104 in chamber 114, that delivers some form of energy to the workpiece 104. Examples of typical energy sources that are well known in the art include, but are not limited to, radiant heat lamps, inductive heaters or IR type resistive heaters. In this configuration the energy source 181 is turned "on" and maintained for a specified period of time or until the workpiece reaches a desired temperature prior to starting the texturizing process (Step 307). In another embodiment, the workpiece 104 can be preheated outside the chamber 114 and then transferred to the chamber just prior to performing the texturizing process (Completed prior to Step 304).

A stress relief process may also be performed prior to the preheat and texturizing processes to prevent distortion of the workpiece 104 due to relaxation of residual stresses found in the workpiece from other prior manufacturing processes. The residual stresses can be generated by various prior manufacturing operations such as grit blasting and various material forming processes (e.g., milling, drawing, sintering, molding, etc.). The method or process of stress relief is well known in the art of part fabrication and/or manufacturing and the process recipe will depend on the type of material, the amount and type of forming process used, and the tolerance to workpiece distortion.

Figure 4:
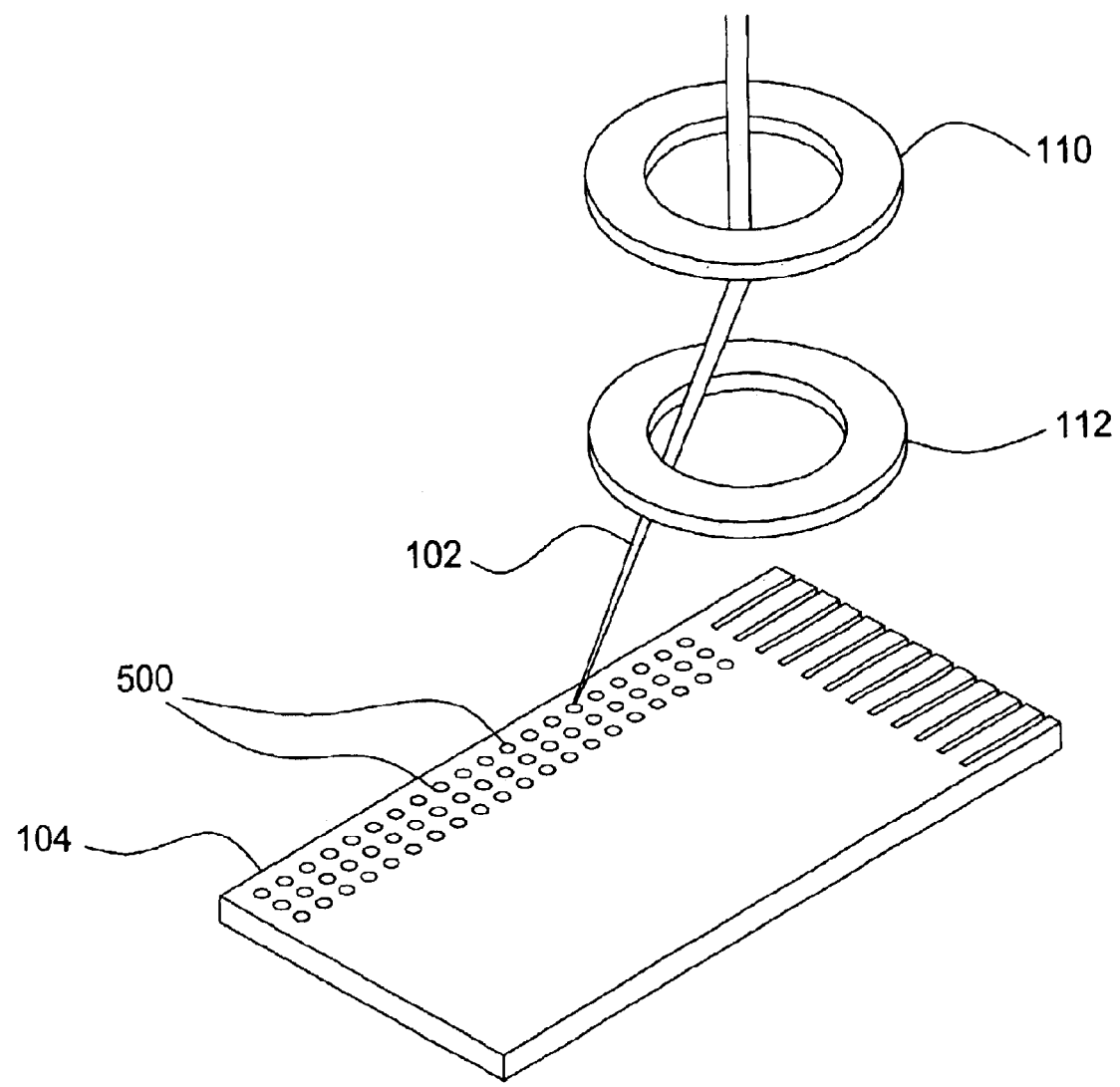
FIG. 4 depicts a schematic illustration of an electron beam sequentially contacting various portions of a workpiece in order to modify the surface thereof.

Referring to FIG. 4, the beam travels through the focusing coil 110 as well as high speed deflector coils 112a and 112b. Depending upon the nature of the signals sent from controller 202, through function generators 204, the beam 202 is scanned across particular portions of the surface of workpiece 104. This results in a plurality of features 500 that are formed on the surface of the workpiece 104. The features 500 may be in a particular geometric pattern. In one embodiment, the workpiece 104 is moved with respect to the impinging electromagnetic beam 102 during the texturizing process. The workpiece may, for example be moved at a travel speed in the range of about 1 meter per minute to about 1.7 meters per minute with respect to electromagnetic beam 102. In one embodiment, the workpiece is rotated along one or more axes of rotation during exposure to the electromagnetic beam 102. The axis of rotation may be, for example, perpendicular or parallel to the incident beam. Due to the size or shape of the workpiece it may be impractical to physically move or rotate the workpiece and thus the electromagnetic beam 102 may be moved across the workpiece 104 to form the desired texture.

In general, where the electromagnetic beam 102 is generated by an electron beam, ion beam or electrical arc, an electrical current will flow to the workpiece 104. Where the electromagnetic beam 102 is an electron beam the current may be in the range of about 15 to about 50 milliamperes (mA), preferably 15 to 40 milliamperes (mA). The energy delivered by the electromagnetic beam 102 can be defined in terms of a power density, which is the average power delivered across a particular cross-sectional area on the surface of the workpiece. In one embodiment the average power density of the electromagnetic beam 102 may be, for example, in the range of about $10^4$ W/mm$^2$ to about $10^5$ W/mm$^2$ at a point on the surface of the workpiece upon which the beam is directed. The peak power density of the electromagnetic beam 102 may be, for example, in the range of about $10^5$ W/mm$^2$ to about $10^7$ W/mm$^2$ at a point on the surface of the workpiece. The peak power density can be defined as a process setting where the beam is at its maximum focus (i.e. smallest possible spot size) at a given power setting. It should be noted that the amount of energy required to form the features 500 on the surface of the workpiece may differ from one type of energy source to another (e.g., electron beam, laser, etc.) due to the efficiency of the absorption or energy transfer to the workpiece.

The power or energy delivered to the surface of the workpiece by the electromagnetic beam is not intended to cause significant or gross distortion (e.g., melting, warping, cracking, etc.) of the workpiece. Significant or gross distortion of the workpiece can be generally defined as a state where the workpiece is not able to be used for its intended purpose due to the application of the texturing process. The amount of energy required to cause significant distortion of the workpiece will depend on the material that the workpiece is made from, the thickness and/or mass of the workpiece near the area being texturized, the shape of the workpiece (e.g., flat, cylindrical, etc.), the amount of residual stress in the workpiece, the actual power delivered to the workpiece, the transfer speed of the beam across the workpiece, the density of texturized features (features 500) on the surface of the workpiece, and/or the dwell time of the beam at any point on the workpiece. In one embodiment to prevent significant distortion in thin workpieces or workpieces that are sensitive to the thermal stresses induced by the texturing process, the following steps may be completed: the beam transfer speed may be increased, the beam may be defocused during the transfer time, or the power of the beam may be decreased during the transfer time, in an effort to reduce the energy delivered to the workpiece that is not being used to form the features 500 on the surface of the workpiece. To reduce the distortion in workpieces that are susceptible to distortion (e.g., geometrically flat, materials that have a high thermal expansion, etc.) in one embodiment the texturizing process may require texturing on both sides of the workpiece to compensate for the stresses induced by the texturizing process on one side of the workpiece.

In another embodiment the heating element 150 in the substrate support 140 may be adapted to cool the workpiece 104 during the texturizing process to reduce the maximum temperature achieved during the texturizing process and/or allow for a controlled cooling rate after texturizing to prevent or reduce distortion in the workpiece. The heating element 150 in this embodiment could be made from a thermoelectric device such as purchased from TE Technology, Inc., Traverse City, Mich. or Ferrotec America Corporation, Nashua, N.H. In another embodiment the workpiece may be clamped to substrate support 140 to restrain the deflection of the workpiece and prevent distortion of the workpiece during texturing.

In general, the beam has a spatial distribution of energy that varies depending upon the composition of the workpiece. The beam generally has a spatial distribution of energy that varies about a central value that may be, for example, a Gaussian distribution. In other embodiments, the beam may have a non-Gaussian distribution. For example, the beam may have a spatial distribution of energy across the beam diameter which is substantially more uniform across the beam diameter than a Gaussian distribution. In one embodiment, useful for treating austenitic steel, approximately 90% to about 98%, preferably about 98%, of the beam energy is contained in a beam diameter of about 0.4 mm with the remaining energy outside the diameter of about 0.4 mm, but generally within a 1 mm diameter.

Figure 5A:
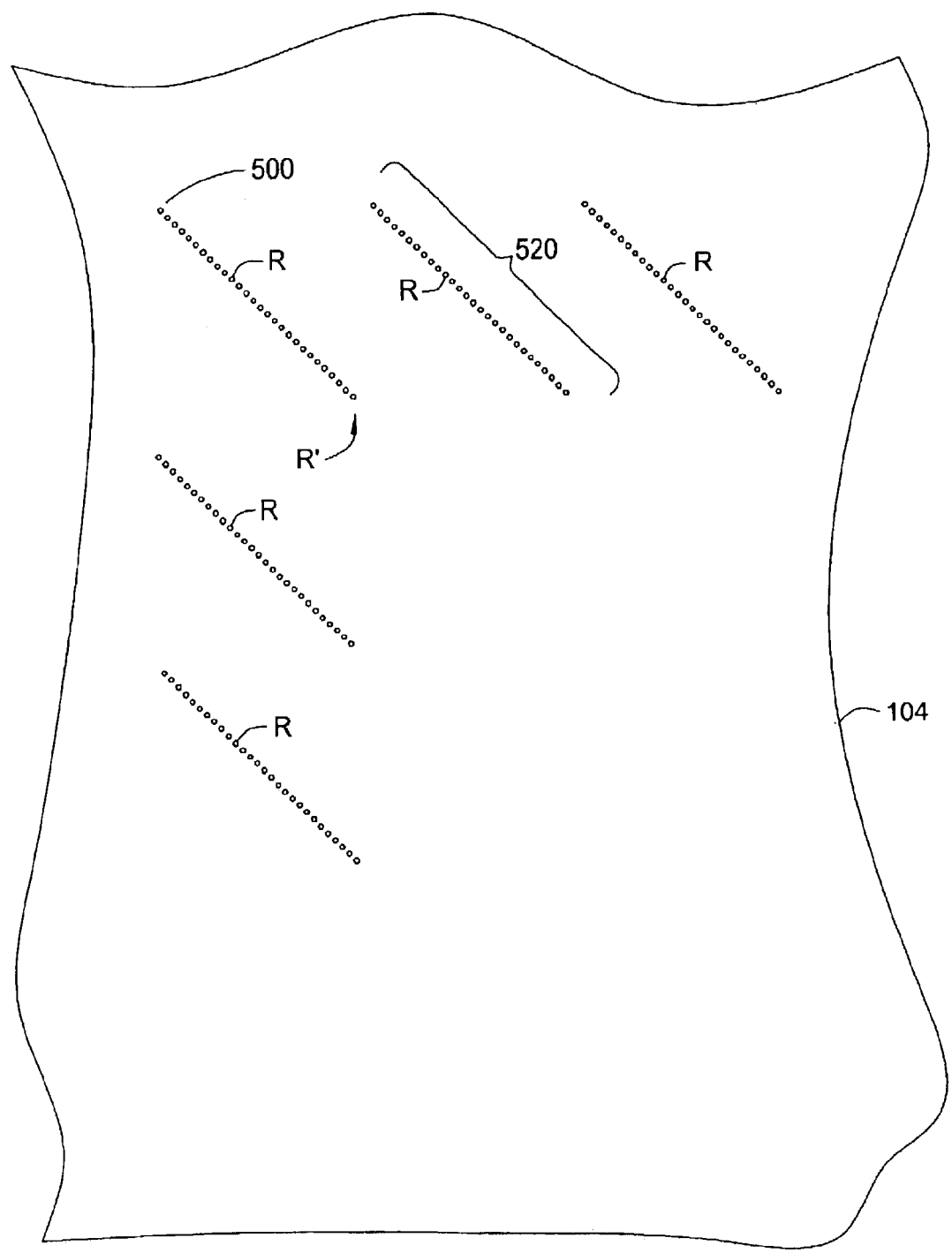
FIG. 5A depicts a schematic illustration of a top view of a workpiece surface that has been texturized using an embodiment described herein.

In one embodiment, the beam is scanned across the surface of the workpiece using high speed deflector coils 112a, 112b, but not using focus coil 110. In this embodiment, the beam remains focused throughout the texturizing process. FIG. 5A depicts a schematic illustration of a top view of a workpiece surface 104 that has been texturized. The beam undergoes a primary deflection using high speed deflector coils 112a, 112b. High speed deflector coils 112a, 112b move the beam in the vicinity of various reference points R. The beam is deflected between reference points R at a primary deflection frequency. The primary deflection frequency may be in the range of about 23 to about 32 hertz. Once the, beam is brought within the vicinity of a reference point, the beam undergoes a plurality of secondary deflections. Each secondary deflection results in the beam being moved to a secondary reference point, for example, R' as shown in FIG. 5A. Upon undergoing a particular secondary deflection, the beam interacts with the surface of the workpiece 104 in order to form a feature thereon. The secondary deflection frequency may be in the range of about 400 hertz to about 10 kilohertz. In one embodiment the secondary deflection frequency is in the range of about 2 kilohertz to about 4 kilohertz.

The secondary deflections may be spatially arranged such that the features 500 form a pattern 520 about reference point R. The pattern 520 depicted in FIG. 5A is a linear pattern. Other patterns are, of course, also possible, including, circular, elliptical, triangular, star-shaped, circular with center spot, among other patterns. The number of secondary deflections about each reference point R is variable, and may, for example, be up to about 100.

Figure 5B:
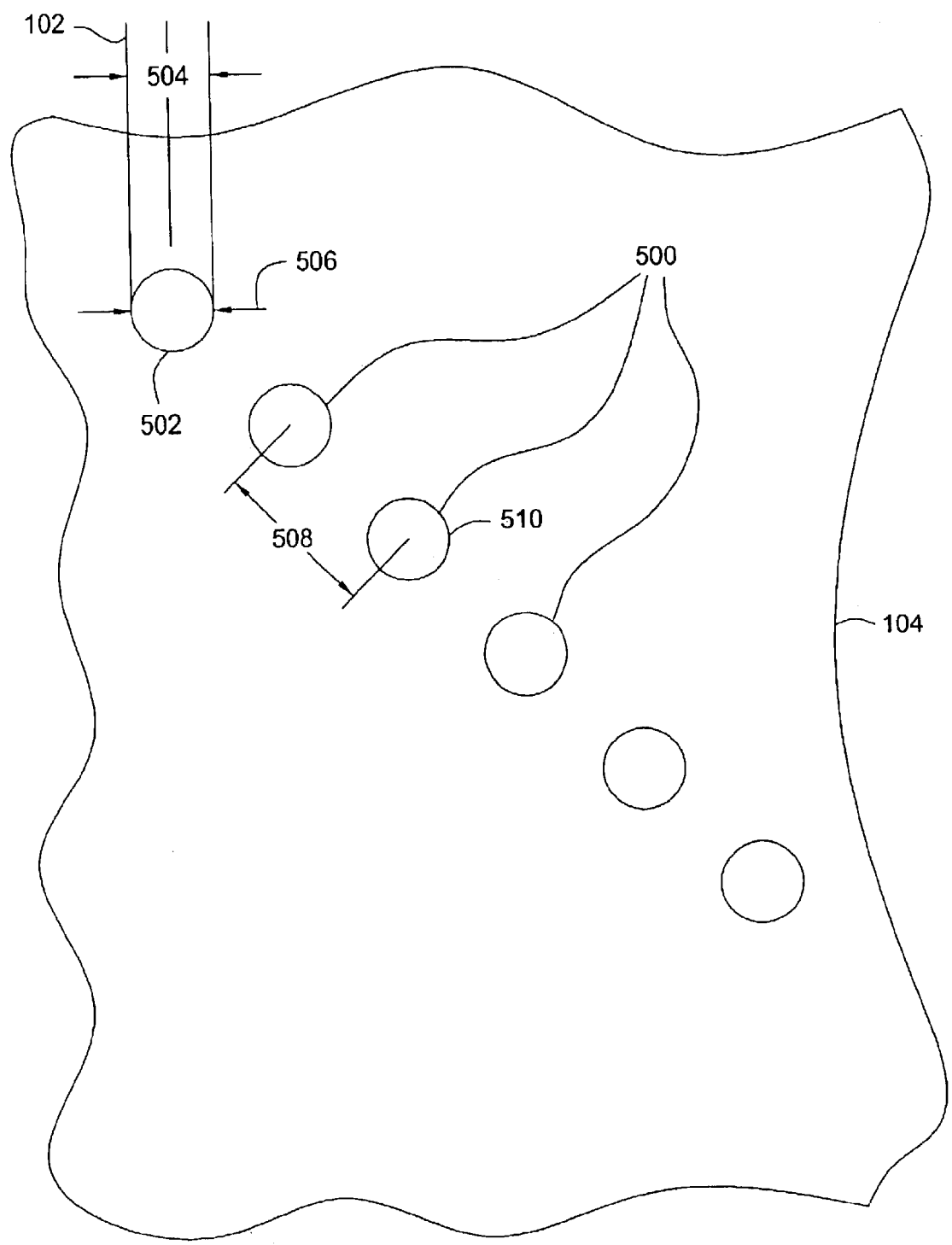
FIG. 5B depicts a close-up, top view of the workpiece surface of FIG. 5A and features thereon.
Figure 5C:
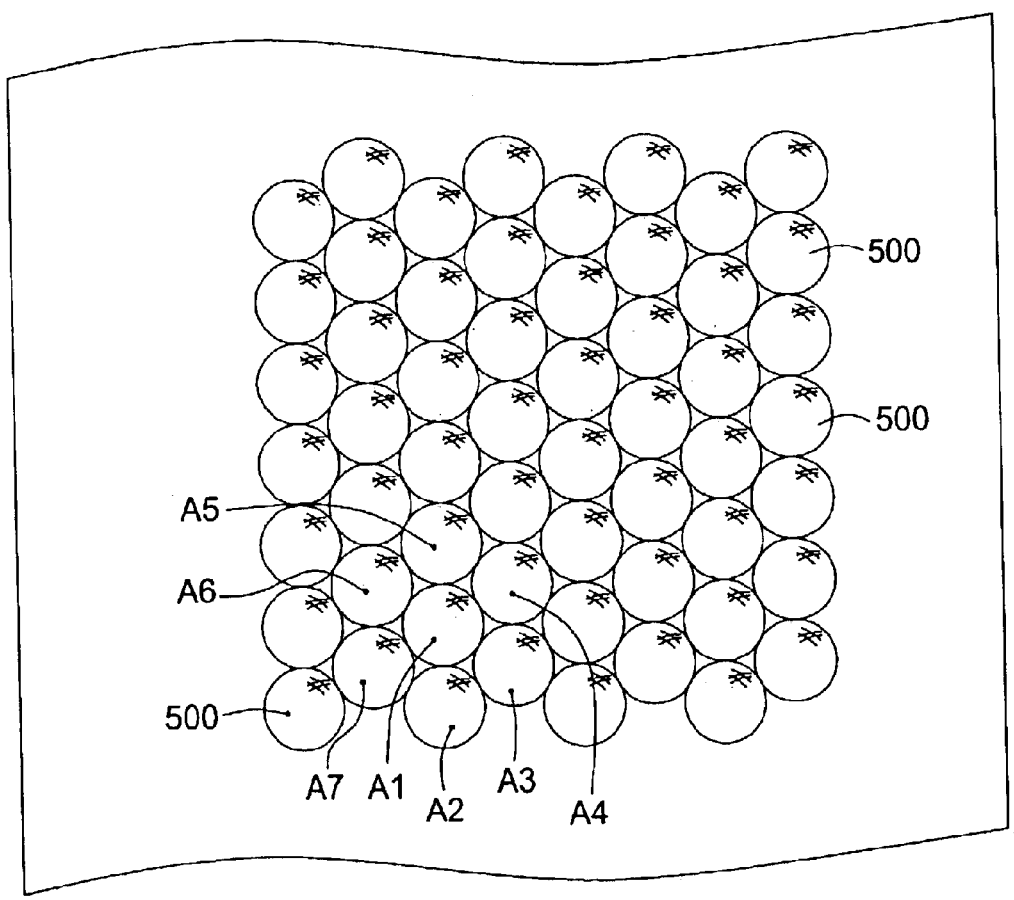
FIG. 5C depicts a close-up, top view of the workpiece surface containing an hexagonal close packed array of features thereon.

In one embodiment the features 500 are arranged in a hexagonal close packed (HCP) pattern as shown in FIG. 5C which can be defined as one feature 500 (shown as A1) surrounded by six tightly arranged features 500 (shown as A2 through A7). The HCP pattern can be repeated to form an array of features across the surface of the workpiece. The use of the hexagonal close packed pattern maximizes the density of features 500 on a surface to improve the adhesion of the deposited material on the surface of the workpiece 104 during the use of the texturized workpiece 104 in subsequent deposition processes (described below). The texture density can be defined and measured as the number of features 500 within a square centimeter of surface area on the workpiece 104. The texture density can vary by the workpiece material, type of material deposited in the subsequent process, angle of incidence of the electromagnetic beam, and the size and spacing of the various features 500, but generally between about 1 and about 300 features per square centimeter, and preferably between about 20 and about 260 features per square centimeter. For example part number 0020-46649, purchased from Applied Materials Inc., Santa Clara Calif., made out of titanium used in a PVD tantalum deposition process may contain between about 200 and about 260 features per square centimeter across the textured surface. In yet another example, the Applied Materials Inc. part number 0020-44438 made from aluminum used in a PVD tantalum or tantalum-nitride deposition process may contain between about 30 and about 50 features per square centimeter across the textured surface.

FIG. 5B depicts a close-up top view of the surface of workpiece 104 that has been texturized. The electromagnetic beam 102 has a beam diameter 504. The beam diameter 504 at the point in which electromagnetic beam 102 contacts the surface of the workpiece 104 may be about 0.4 mm to about 1 mm in diameter, and preferably about 0.4 mm in diameter. The beam focuses on region 502 on the surface of the workpiece 104, and remains focused on region 502 for a period of time known as a dwell time. During the dwell time, the beam interacts with region 502 of the surface of the workpiece 104 to form a feature thereon.

As depicted in FIG. 5B, the feature thus formed may have a diameter 506 that is substantially the same size of the beam diameter 504 at the point in which the electromagnetic beam 102 contacts the surface of workpiece 104.

In general, the dwell time of the beam may be in the range of about 0.1 millisecond to about 2 milliseconds. The transit time that elapses between each secondary deflection may be about 1 microsecond to about 50 microseconds. The inventors have found that when employing such short transit times on materials such as austenitic steel, there is no need to defocus the beam or reduce the power during transit from one feature to the next. Surface exposed to the beam only during the beam transit time does not melt appreciably, thus features are only formed in those areas upon which the beam dwells. Once the dwell time has elapsed, the electromagnetic beam 102 is deflected to another region, such as region 510, on the surface of workpiece 104. In one embodiment the dwell time can be decreased to less than 1 millisecond, for example about 0.1 milliseconds, and/or the transfer time may be decreased to less than 1 microseconds to prevent distortion of the workpiece due to geometrically thin or fragile areas of the workpiece in which the features 500 are being placed.

In another embodiment, the focus coil 110 moves the electromagnetic beam 102 rapidly in and out of focus in order to reduce the beam power impinging upon the surface of the workpiece 104 during transit time. In this manner the energy delivered to the surface of the workpiece 104 is more tightly controlled. Similarly to the method described above, a plurality of features 500 are formed on the surface of workpiece 104.

Figure 5D:
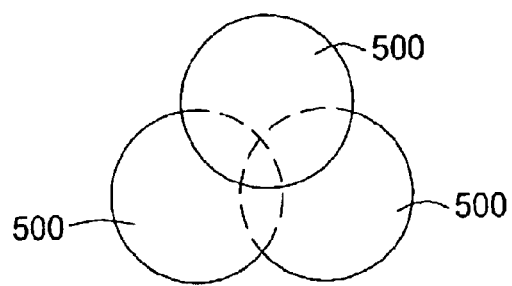
FIG. 5D depicts a close-up, top view of the workpiece surface containing an overlapping array of features thereon.

The plurality of features 500 may be depressions, protuberances, or combinations thereof. The plurality of features 500 may be arranged in a pattern with substantially uniform spacing 508 between features 500. While FIGS. 5A, 5B and 5C depict a pattern of discrete features 500, features 500 may contact, overlap, or merge with one another. One possible embodiment of an overlapping design is shown in FIG. 5D. In another embodiment, it may also be possible to form an array of overlapping features 500 to form a trench or groove on the surface of the workpiece to promote adhesion of the deposited film.

Figure 6:
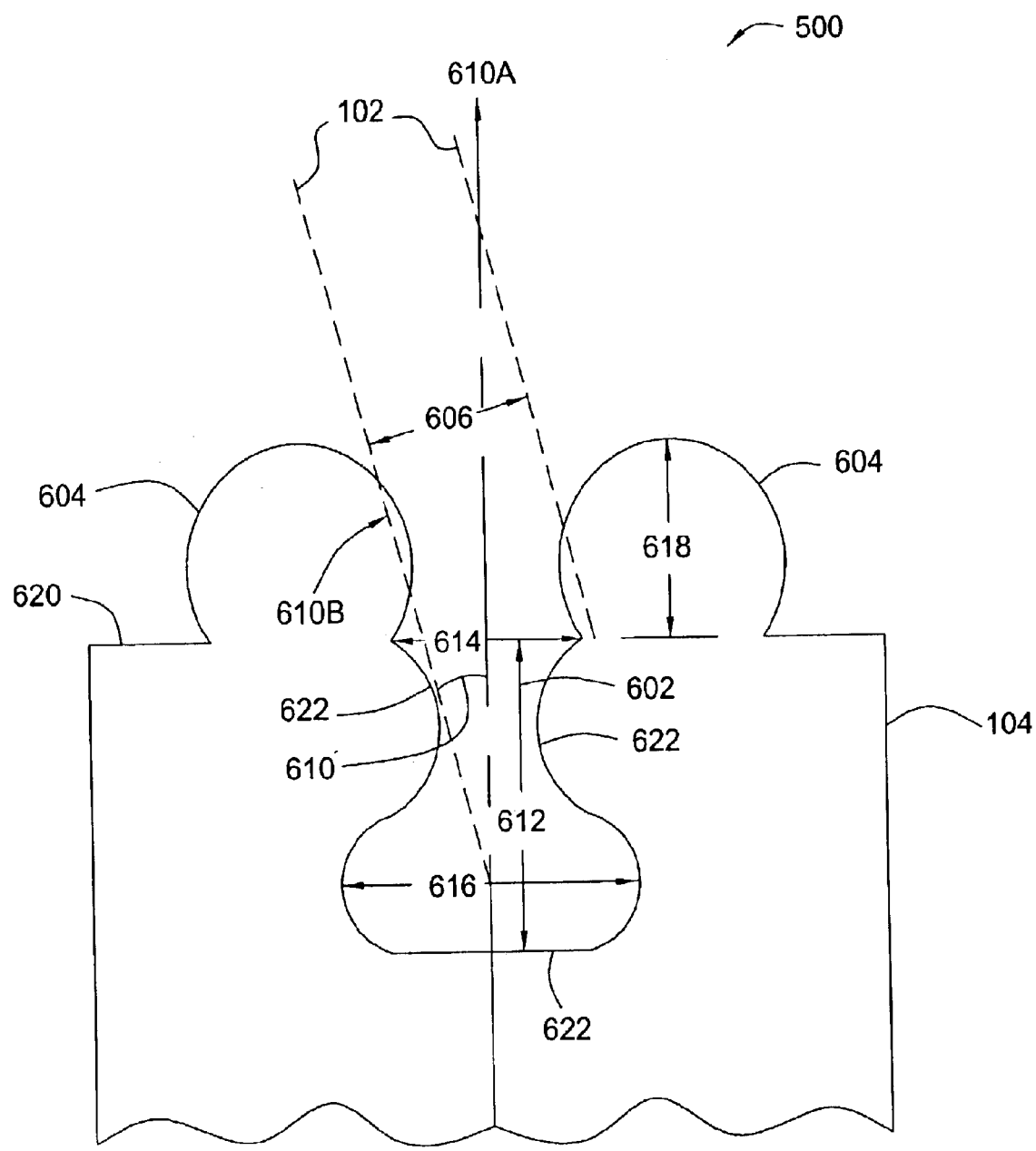
FIG. 6 depicts a schematic, cross-sectional illustration of a feature formed on a surface of a workpiece, according to an embodiment described herein.

FIG. 6 depicts a schematic, cross-sectional illustration of one embodiment of a surface of a workpiece 104 that has been contacted with an electromagnetic beam such as electromagnetic beam 102 having a beam diameter 606. As shown the electromagnetic beam 102 impacts the surface at an angle of incidence 610. The angle of incidence 610 is defined as the angle between a ray 610*a* normal to the surface of the workpiece 104 and a ray 610*b* parallel to electromagnetic beam 102. The angle of incidence may be in the range of about −45 degrees to about 45 degrees, preferably about −30 degrees to about 30 degrees. Stated differently, the angle of incidence may be within about 45 degrees measured with respect to a ray 610*a*. Features 500 generally includes a depression 602 and protuberances 604 are formed upon exposure to electromagnetic beam 102.

The deflection of the beam at the angle of incidence 610 can also have the effect of improving the hardware lifetime or maintenance cycle of the hardware due to the line of sight shielding of the various hardware components in the column 120 to the material coming off the surface during the texturizing process. The deflection of the beam relative to the column 120 can minimize, and preferably prevent, ions from moving up the column and harming the cathode 106 and other components within the column 120.

While the inventors do not wish to be held to any one particular explanation behind the formation of these features 500, it is believed that material on the surface and on the interior of the workpiece 104 is heated to a high temperature, in some cases above the boiling temperature of the material comprising the workpiece 104. The rapid heating of portions of the workpiece causes material to be ejected outwards. This forms depression 602 in a location from which the material has been ejected, and also forms protuberances 604 in locations to which the ejected material has deposited.

The depression 602 is characterized as having a surface 622. The depression 602 has a depth 612, defined as the perpendicular distance from top surface 620 of the workpiece 104 to the bottom of the depression 602, in the range of about 0.001 inches to about 0.060 inches. The depression has a surface diameter 614 in the range of about 0.005 inches to about 0.100 inches, but preferably between about 0.008 to about 0.089 inches. The depression has an interior diameter 616. The interior diameter 616 is defined as the greatest distance between two points on surface 622, parallel to top surface 620 of workpiece 104. In one embodiment, the depression has an interior diameter 616 greater than the surface diameter 614. In another embodiment, the depression has an interior diameter 616 smaller than the surface diameter 614. In one embodiment, protuberances 604 have a height 618 that is in the range of about 0.002 inches to about 0.060 inches, and preferably between about 0.002 to about 0.046 inches. An example of a range of dimensions for features 500 formed in an aluminum workpiece, Applied Materials Inc. part number 0020-44438, is a surface diameter 614 between about 0.029 and about 0.089 inches, a height 618 of between about 0.017 and about 0.046 inches, and a depth 612 of about 0.023 to about 0.036 inches. In another example of a typical range of dimensions for features 500 formed in an titanium workpiece, part number 0020-46649, is a surface diameter 614 between about 0.012 and about 0.031 inches, a height 618 of between about 0.002 and about 0.004 inches, and a depth 612 of about 0.006 to about 0.011 inches.

While FIG. 6 depicts the specific formation of features, including a depression 602 and two protuberances 604, it is within the scope of the invention to form only depressions or only protuberances, or varying ratios and combinations of depressions and protuberances. Furthermore the depressions may have varying shapes, depths, surface diameters, and interior diameters. Similarly, the protuberances may have varying shapes and heights as well as varying angles of contact with the workpiece surface. The protuberances and depressions may contact, overlap, or merge with one another or be spaced apart from one another. In one embodiment, the spacing between protuberances or between depressions is less than about 0.02 inches.

In one embodiment the beam may make small deflections during the dwell time of the beam to form a feature that is not the static shape of the projected electromagnetic beam on the surface of the workpiece. Desired shapes created by the deflection of the beam during the dwell time may include, for example, a star, an oval, a diamond, a triangle, a rectangle, a pentagon, a hexagon, or other multisided shapes.

In one embodiment, the workpiece 104 is sprayed with a stream of hard particles ("bead blasting") after the surface texturizing treatment with the electromagnetic beam 102. The hard particles may comprise, for example, aluminum oxide, garnet, silicon carbide, or silicon oxide, and may have a particle size of about 24 to about 80 grit (about 535 microns to about 192 microns). Typically the "bead blasting" process is completed at a delivery pressure of between about 5 to about 70 psi. The hard particles may be sprayed from a nozzle and may be sprayed dry or as a part of an aqueous slurry composition. In general, the bead blasting treatment introduces roughness on the surface of the workpiece 104 that is finer than the roughness generated by using the electromagnetic beam 102. The bead blasting treatment also removes any loosely adhered material, such as protuberances, formed by the texturizing process. The roughness formed by the bead blasting treatment increases the retention or adhesive properties of the textured component as material is deposited thereon. In addition, bead blasting can be used to clean the components after use. The bead blasting treatment removes the material deposited on the component and restores the surface finish provided initially to the component prior to the deposition process.

In another embodiment, the workpiece 104 is chemically roughened after the surface texturing process. The term chemically roughened should be broadly construed and includes, but is not limited to, chemically etching the surface of the component, electrochemically etching the surface of the component, or combination thereof. The chemical roughening process, like the bead blasting process described above, is used to form a rough surface that can help improve the adhesion of the deposited film to the workpiece 104. The method of chemically roughening the surface of the workpiece 104 depends on the material from which the workpiece is made and should be commonly known or understood by one skilled in the art of chemical cleaning, metallography and chemical machining. The term chemically etching is meant to generally describe, but is not limited to, the process of removing material from the surface of a workpiece by the use of chemical activity. An example of typical chemicals that could be used may be aqueous acidic solutions, containing such acids as sulfuric acid ($H_2SO_4$), nitric acid ($HNO_3$), hydrochloric acid (HCl) or combination thereof, or aqueous basic solutions containing such chemicals as potassium hydroxide (KOH), ammonia hydroxide ($NH_4OH$) or combination thereof. In another embodiment the process of chemical etching the surface of the workpiece may also be completed by use of dry etching (plasma etch) process. Dry etching is generally a process of generating a plasma to energize or dissociate reactive gas species that interact with and ultimately remove material from the workpiece surfaces. The term electrochemically etching is meant to generally describe, but is not limited to, the process of removing material from the surface of a workpiece by the application of an anodic bias to the workpiece relative to another element that acts as a cathode and is also submerged in an electrolyte solution. An example of an electrochemically etching process that may be adapted to benefit from the invention is described in patent application entitled "Electrochemically Roughened Aluminum Semiconductor Processing Apparatus Surface," Ser. No. 09/918,683 filed Jul. 27, 2001, which is incorporated by reference to the extent not inconsistent with the claims, aspects and description herein.

Method of Reducing Particle Contamination

In another embodiment of the invention, a method of reducing contamination in a process chamber is provided. In one embodiment, the method reduces contamination of a substrate provided to the process chamber. In general, the chamber may be any enclosed or partially enclosed chamber that may be susceptible to materials condensing on interior surfaces of the chamber or on surfaces of components within the chamber. In one embodiment, the chamber is a substrate processing chamber. The chamber may be one which is suitable for vacuum processing of semiconductor substrates or glass panels. The wafer processing chamber may be, for example, a deposition chamber. Representative deposition chambers include sputtering, physical vapor deposition (PVD) and ion metal plasma (IMP) chambers, chemical vapor deposition (CVD) chambers, etch chambers, molecular beam epitaxy (MBE), atomic layer deposition (ALD) chambers, among others. The chamber may also be, for example, an etch chamber, such as a plasma etch chamber. Other examples of suitable process chambers include ion implantation chambers, annealing chambers as well as other furnace chambers. In a preferred embodiment, the chamber is a substrate process chamber in which a substrate is exposed to one or more gas-phase materials.

Figure 7:
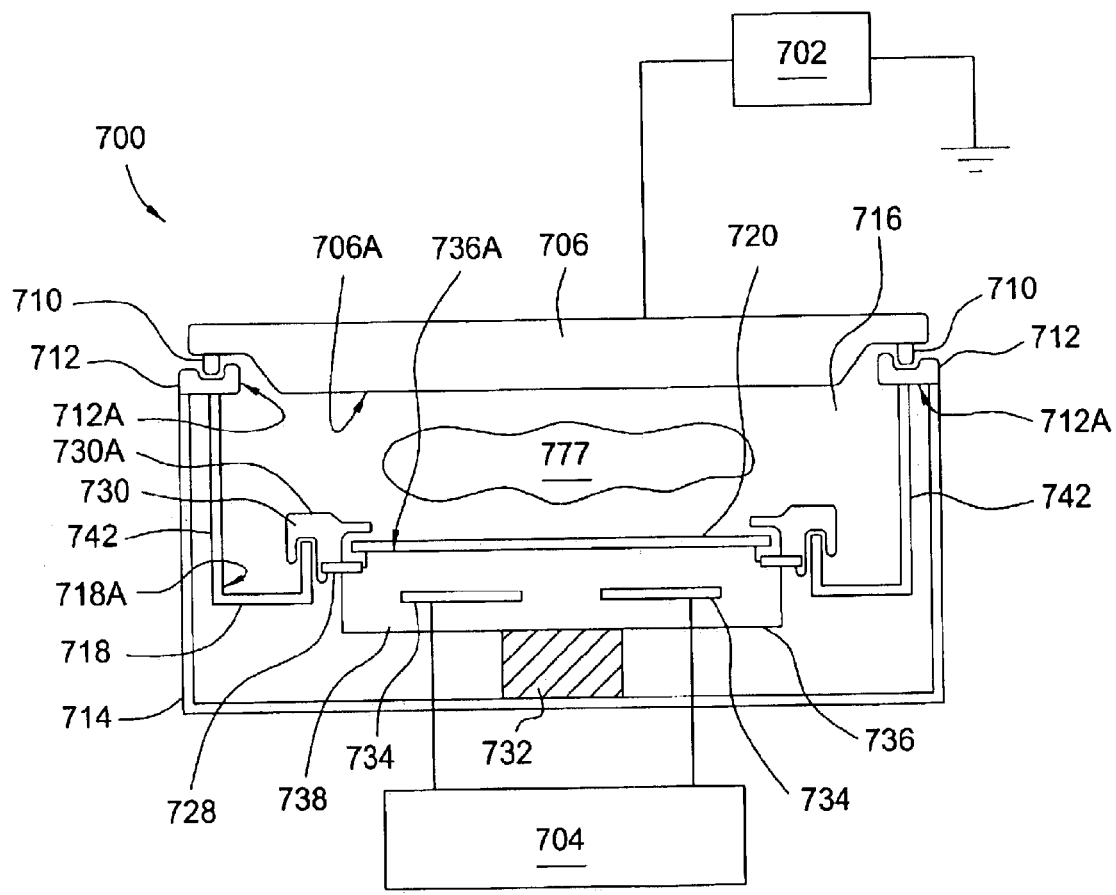
FIG. 7 depicts a schematic, cross-sectional, illustration of a sputtering reactor in which contamination may be reduced using embodiments described herein.

FIG. 7 illustrates a simplified schematic cross-sectional illustration of a sputtering reactor 700 in which contamination may be reduced using embodiments described herein. The reactor 700 contains a vacuum chamber 716 and a substrate support 736 having a top surface 736A. The substrate support 736 may be, for example, an electrostatic chuck. Reactor 700 further comprises a shield assembly 718 and an elevator system 732. A substrate 720 (e.g., a semiconductor wafer) is positioned upon top surface 736A of the substrate support 736. In the exemplary arrangement, the substrate support 736 is attached, as by a plurality of screws, to a conventional vertically movable elevator system 732. Certain hardware such as gas inlet manifolds and/or vacuum pumps are omitted for clarity.

The exemplary vacuum chamber 716 includes a cylindrical chamber wall 714 and a support ring 712 which is mounted to the top of the chamber wall. The top of the chamber is closed by a target plate 706 which has an interior surface 706A. The target plate 706 is electrically insulated from the chamber walls 714 by an annular insulator 710 that rests between the target plate 706 and the support ring 712. Generally, to ensure the integrity of the vacuum in the chamber 716, o-rings (not shown) are used above and below the insulator 710 to provide a vacuum seal. The target plate 706 may be fabricated of a material that will become the deposition species or it may contain a coating of the deposition species. To facilitate the sputtering process, a high voltage power supply 702 is connected to the target 706.

The substrate support 736 retains and supports substrate 720 within the chamber 716. The substrate support 736 may contain one or more electrodes 734 imbedded within a support body 738. The electrodes are driven by a voltage from an electrode power supply 704 and, in response to application of the voltage, the substrate 720 is electrostatically clamped to the support surface of the chuck. The chuck body may comprise, for example, a ceramic material.

A wall-like cylindrical shield member 742 is mounted to the support ring 712. The cylindrical shape of the shield member-742 is illustrative of a shield member that conforms to the shape of the chamber and/or the substrate. The shield member 742 may, of course, be of any shape. Exemplary parts may include 0020-45544, 0020-47654, 0020-BW101, 0020-BW302, 0190-11821, 0020-44375, 0020-44438, 0020-43498, 0021-JW077, 0020-19122, 0020JW096, 0021-KS556, 0020-45695 available from Applied Materials Inc., Santa Clara Calif.

In addition to the shield member 742, the shield assembly 718 also includes an annular deposition ring 730 having an inner diameter which is selected so that the ring fits peripherally over the edge of the substrate 720 without contacting the substrate. The shadow ring rests upon an alignment ring 728 and the alignment ring 728 is supported by a flange (not shown) that extends from the substrate support 736. In addition, other components, such as clamp rings used in physical vapor deposition (PVD), can texturized according to processes described herein and used in applications contemplated herein. Exemplary annular shadow rings and/ or clamp rings include 0020-43171 and 0020-46649 available from Applied Materials Inc., Santa Clara Calif.

During a sputter deposition process, process gas is supplied to the chamber and power is supplied to target plate 706. The process gas is ignited into a plasma and is accelerated toward the target plate 706. The process gas thereby dislodges particles from the target plate and the particles deposit onto substrate 720 forming a coating of deposited material thereon.

While the shield assembly 718 generally confines the plasma and sputtered particles within a reaction zone 777, inevitably, sputtered particles, initially in a plasma or gaseous state, condense on various interior chamber surfaces. For example, sputtered particles may condense on an interior surface 718A of shield assembly 718, on interior surface 706A of target plate 706, on an interior surface 712A of support ring 712, on an interior surface 730A of deposition ring 730, as well as other interior chamber surfaces. Furthermore, other surfaces, such as the top surface 736A of substrate support 736 may become contaminated either during or in between deposition sequences.

In general the term "interior surface" refers to any surface that has an interface with chamber 716. Chamber component refers to any detachable element housed completely or partially within a process chamber. The chamber component may be a vacuum chamber component, i.e. a chamber component placed within a vacuum chamber, such as, for example, chamber 716. The condensed matter that forms on the interior surface of a chamber component, generally has only limited adhesion, and may release from the component and contaminate the substrate 720.

In order to reduce the tendency of condensed foreign matter to detach from a process chamber component, the chamber component, such as, for example, a shield assembly 718, a target 706, a support ring 712, deposition ring 730, coil (not shown), coil supports (not shown), deposition collimators (not shown), pedestal 738, alignment ring 728, shutter disk (not shown) or a substrate support 736, is provided to a texturizing chamber, such as, for example, work chamber 114 of apparatus 100.

Figure 8:
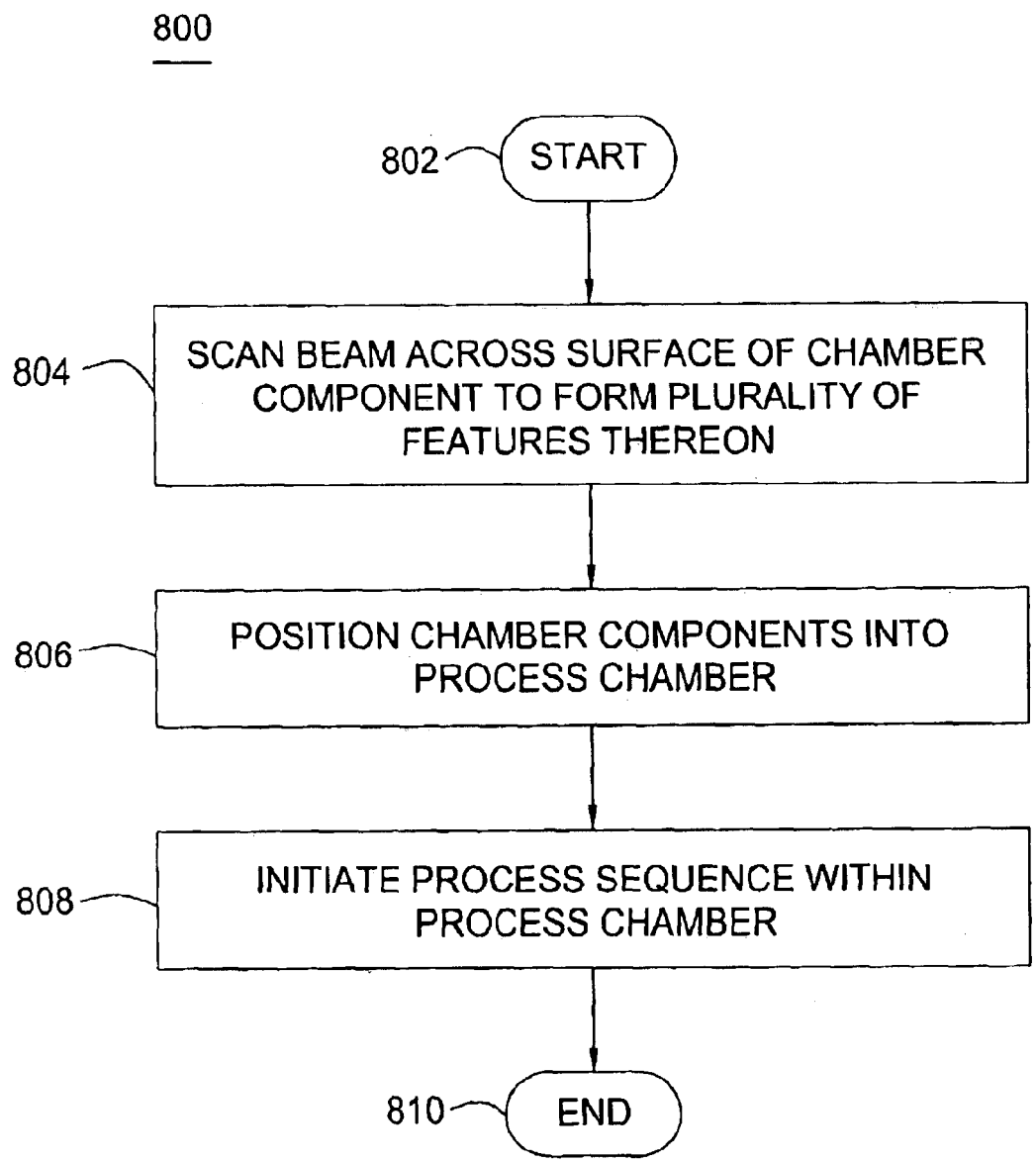
FIG. 8 depicts a series of method steps that may be used to reduce contamination in a process chamber using embodiments described herein.

Referring now to FIG. 8, a series of method steps 800 begins at step 802 and proceeds to step 804 wherein a beam of electromagnetic energy is scanned across the surface of one or more chamber components to form a plurality of features thereon. The features may be depressions, protuberances, or combinations thereof. The nature of features including depressions and protuberances thus formed on the surface of the chamber component are as for workpiece 104 described previously. In general, step 804 encompasses the method steps 301 to 314 described in FIGS. 3A, 3B, 3C, 3D, 3E and 3F.

In an alternate embodiment, the method further comprises roughening the surface of the process component, or workpiece, after the features 500 are formed on the surface by the electromagnetic beam 102. The process of roughening the surface of the workpiece after the features 500 are formed, such as "bead blasting" or chemical roughening, can improve the adhesion of the deposited material to the workpiece, because the surface 622 and the surface of the protuberance 604 as formed by the surface texturing treatment tends to be rather smooth (Surface roughness ($R_a$) of about 64 microinches). The smooth surfaces created by the texturizing treatment are thought to be caused by surface tension acting on the molten surfaces created during the texturizing process. The roughened surface by "bead blasting" or chemical roughening is important since the intrinsic (e.g., crystallographic defects, stacking faults, etc.) and/or extrinsic stress (e.g., temperature difference between the workpiece and the deposited material, thermal expansion mismatch, etc.) found in the deposited material can cause the deposited material to buckle and/or fracture. The buckling or fracture of the deposited material can generate particles that may lead to contamination of the substrate 720. The addition of the surface roughening aspect of this invention helps improve the adhesive properties of the deposited material to the surface of the workpiece through a localized mechanical attachment or bonding. In one embodiment the chamber component, or workpiece, surface is further roughened after the texturizing treatment in step 804 by spraying with a stream of hard particles ("bead blasting") at the surface of the component. The hard particles may comprise, for example, aluminum oxide, garnet, silicon oxide or silicon carbide, and may have a particle size of about 24 to about 80 grit. Typically, the "bead blasting" process is completed at a delivery pressure of between about 5 to about 70 psi. The process of bead blasting the part also has the effect of removing lightly adhered material left over from the the texturizing process.

In another embodiment of the present invention the process kit component (or workpiece) is chemically cleaned after the texturizing process. Due to the stringent cleanliness requirements needed to meet semiconductor manufacturing device yield goals, any material that can particulate, decompose, vaporize, or be detached from a process component during processing must be minimized. Some typical contamination sources found after the texturizing process may include, for example, lightly adhered material caused by the "eruption" of the process component's material due to localized heating by the electromagnetic beam, contamination from handling of the process component, and/or any contamination from the texturizing, bead blasting, stress relieving or chemical roughening chambers. A typical cleaning process can, for example, contain process steps of a caustic etch/degrease step, rinse in DI water, etch in an acidic or basic solution to remove contamination in or on the surface layer of the process component, a high pressure DI water rinse, an ultrasonic or megasonic DI rinse, and vacuum oven or nitrogen blow dry. The cleaning requirements needed to meet semiconductor manufacturing device yeild goals should be commonly known or understood by one skilled in the art of UHV chemical cleaning and/or semiconductor manufacturing.

In one embodiment the cleaning process is completed after all of the texturizing process steps have been completed, but prior to the step of placing the component in a process chamber. This embodiment thus helps to assure that all contamination is removed prior to use of the process component in the process chamber. In another embodiment the cleaning process is only completed after the bead blasting process to remove any contamination leftover after the texturizing process, contamination due to handling, and any leftover bead blast particles. In yet another embodiment it may be possible to clean the component prior to completing the texturizing process as long as the process component is handled in a clean environment and rinsed in DI water prior to packaging or delivery to the process chamber.

Referring to step 806, the one or more chamber components are then positioned within a process chamber, such as, for example, chamber 716 in sputtering reactor 700. As indicated in step 808, a process sequence is initiated within the reactor, such as forming a sputtered layer on substrate 720 within reactor 700. The method ends with step 810.

While the above discussion details a method of reducing contamination in a sputtering reactor, it is within the scope of the invention to use a method to reduce contamination in any number of different types of process chambers. The present invention is applicable to any process chamber comprising an interior surface upon which materials may condense. Any component partially or completely within the process chamber that may be removed from the chamber and placed in a texturizing apparatus, such as apparatus 100, is suitable to be treated using a method of the present invention.

The method may be used to reduce contamination in process chambers designed to deposit, etch, heat, or otherwise modify a workpiece, substrate, or layer disposed therein. In one embodiment, the method is used to reduce contamination in a chamber that is designed to sputter deposit a layer of refractory metal or refractory metal compound such as a layer of titanium, titanium nitride, tantalum, tungsten, or tantalum nitride on a substrate. In other similar embodiments of the invention, the texturizing method can be used to reduce contamination in a Molecular Beam Epitaxy (MBE), Atomic Layer Deposition (ALD), Chemical Vapor Deposition (CVD) or Dry Etch process chambers, among others. Components that may require the texturizing process generally include components that receive some amount of deposition during the processing cycle (during deposition or cleaning processes) and the deposited film has a tendency to directly or indirectly contaminate the substrate. An example of typical components requiring texturizing in a non-sputtering reactor, such as from the MxP+, Super-e or eMax etch systems purchased from Applied Materials Inc., Santa Clara Calif , are the components: 0040-41188, 0040-41189, 0021-15694, 0040-45966, 0040-44917, 0020-17482, 0020-07569, 0020-07570, 0020-07571, 0020-07567, and 0020-07568.

In another embodiment, the one or more chamber components are removed from the process chamber after step 808 and a process to remove condensed foreign matter that may be adherent to the texturized surfaces is initiated.

The removal of condensed foreign matter may be accomplished by spraying the surface of the one or more process chamber components with a stream of hard particles. The hard particles may comprise, for example, aluminum oxide, garnet, silicon oxide or silicon carbide, and may have a particle size of about 24 to about 80 grit. Preferably, the spraying is sufficient to remove the foreign matter without substantially modifying the texture (i.e., the depressions and protuberances) on the surface of the component.

In another embodiment, a chemical fluid is applied to the surface of the one or more process chamber components in order to remove condensed foreign matter thereon. The chemical fluid treatment may comprise for example, soaking or spraying the surface with chemicals such as degreasing compositions, sodium hydroxide, potassium permanganate, potassium hydroxide, ammonium hydroxide, hydrogen peroxide, nitric acid, hydrofluoric acid, hydrochloric acid, and combinations thereof.

The treatment with chemical fluids may be in addition to or in place of spraying with hard particles. Alternatively, other methods of removing foreign matter from the texturized surfaces are also contemplated. Preferably, the chemical treatment does not reduce the macro-roughness of the depressions formed during the texturizing process. In this manner the component may be replaced into the chamber and once again provide enhanced adhesion for matter that condenses on the surface.

In one embodiment of the present invention a texturizing process may entail adding a material of similar composition to the workpiece by, for example, a process of arc welding, MIG welding, MBE or other similar processes that can be used to form protuberances on the surface of the workpiece. To assure the adhesion of the added material, the process may require that it be completed in a vacuum chamber, in a non-oxidizing (e.g., oxygen free) environment, and/or where the workpiece is heated to a temperature that is near the melting point of the material. The addition of the material to form protuberances is thus meant to promote adhesion of the deposited film to the workpiece. It is envisioned that this embodiment could replace or be added to the process steps 310 and 804 as described in FIGS. 3A through 3F and FIG. 8, respectively.

Although several preferred embodiments which incorporate the teachings of the present invention have been shown and described in detail, those skilled in the art can readily devise many other varied embodiments that still incorporate these teachings.

What is claimed is:

1. A method of providing a texture to a surface of a component for use in a semiconductor process chamber, comprising:

scanning an electromagnetic beam across the surface of the component for a sufficient period of time to form a plurality of features thereon; and roughening the surface and features of the component.

2. The method of claim 1, wherein scanning comprises a transit time and a dwell time.

3. The method of claim 1, wherein the electromagnetic beam has a power density at a point on the surface of the component upon which the beam is directed in a range of about $10^4$ W/mm$^2$ to about $10^7$ W/mm$^2$.

4. The method of claim 1, wherein roughening the surface of the component comprises bead blasting the component.

5. The method of claim 1, wherein roughening the surface of the component comprises chemically roughening the component.

6. The method of claim 1, further comprising heating the component prior to scanning the electromagnetic beam.

7. The method of claim 6, wherein heating the component comprises pre-heating the component to a temperature that is less than a temperature at which the component begins to melt, flow, or undergo substantial decomposition.

8. The method of claim 6, wherein the component is heated using a radiant heat lamp, inductive heater, or an IR type resistive heater.

9. The method of claim 4, wherein bead blasting is performed using grit particles comprising aluminum oxide, garnet, silicon carbide, silicon oxide or combinations thereof.

10. The method of claim 4, further comprising chemically cleaning the component after bead blasting the component.

11. The method of claim 5, further comprising chemically cleaning the component after chemically roughening the component.

12. The method of claim 1, further comprising chemically cleaning the component after forming the plurality of features thereon.

13. The method of claim 1, further comprising stress relieving the component prior to providing a texture to a surface of the component.

14. The method of claim 1, further comprising stress relieving the component after forming the plurality of features.

15. The method of claim 1, further comprising stress relieving the component prior to providing a texture to a surface and stress relieving the component after forming the plurality of features thereon.

16. The method of claim 4, further comprising stress relieving the component after bead blasting the component.

17. The method of claim 1, wherein the electromagnetic beam is used to form features on a second surface of the component to compensate for any possible distortion caused by forming features on a first surface.

18. A method of providing a texture to a surface of a component, comprising:

pumping a texturizing chamber to a pressure in a range of about $10^{-3}$ torr to about $10^{-5}$ torr;

scanning an electron beam across the surface of the component at an electron beam current of between about 15 and about 50 milliamperes and an accelerating voltage of between about 50 and about 160 kilovolts to form a plurality of features thereon; and roughening the surface and features of the component.

19. The method of claim 18, wherein scanning comprises a transit time and a dwell time.

20. The method of claim 18, wherein the electromagnetic beam has a power density at a point on the surface of the component upon which the beam is directed in a range of about $10^4$ W/mm$^2$ to about $10^7$ W/mm$^2$.

21. The method of claim 18, wherein roughening the surface of the component comprises bead blasting the component.

22. The method of claim 18, wherein roughening the surface of the component comprises chemically roughening the component.

23. The method of claim 18, further comprising heating the component prior to scanning the electromagnetic beam.

24. The method of claim 23, wherein heating comprises pre-heating the component to a temperature that is less than a temperature at which the component begins to melt, flow, or undergo substantial decomposition.

25. The method of claim 23, wherein the component is heated using a radiant heat lamp, inductive heater, or a IR type resistive heater.

26. The method of claim 21, wherein bead blasting is performed using grit particles comprising aluminum oxide, garnet, silicon carbide, silicon oxide or combinations thereof.

27. The method of claim 21, further comprising chemically cleaning the component after bead blasting the component.

28. The method of claim 22, further comprising chemically cleaning the component after chemically roughening the component.

29. The method of claim 18, further comprising chemically cleaning the component after forming the plurality of features thereon.

30. The method of claim 18, further comprising stress relieving the component prior to providing a texture to a surface of the component.

31. The method of claim 18, further comprising stress relieving the component after forming the plurality of features.

32. The method of claim 18, further comprising stress relieving the component prior to providing a texture to a surface and stress relieving the component after forming the plurality of features thereon.

33. The method of claim 21, further comprising stress relieving the component after bead blasting the component.

34. The method of claim 18, wherein the electromagnetic beam is used to form features on a second surface of the component to compensate for any possible distortion caused by forming features on a first surface.

35. A process chamber component for use in a process chamber, comprising:

a body having one or more surfaces; and a plurality of features formed on the surfaces, wherein he features have been formed by scanning a beam of electromagnetic energy across a surface of the process chamber component, and wherein the features that are formed are selected from the group consisting of depressions, protuberances, and combinations thereof, and wherein the surfaces are chemically roughened after the plurality of features are formed thereon.

36. The process chamber component of claim 35, wherein the surfaces are chemically cleaned after chemically roughening the process chamber component.

37. A process chamber component for use in a process chamber, comprising:
- a body having one or more surfaces; and
- a plurality of features formed on the surfaces, wherein the features have been formed by scanning a beam of electromagnetic energy across a surface of the process chamber component, and wherein the features that are formed are selected from the group consisting of depressions, protuberances, and combinations thereof, and wherein the component is stress relieved prior to scanning the electromagnetic beam across the surface of the process chamber component.

38. A process chamber component for use in a process chamber, comprising:
- a body having one or more surfaces; and
- a plurality of features formed on the surfaces, wherein the features have been formed by scanning a beam of electromagnetic energy across a surface of the process chamber component, and wherein the features that are formed are selected from the group consisting of depressions, protuberances, and combinations thereof, and wherein the component is brought to a pre-heat temperature prior to step scanning the electromagnetic beam, and wherein the component is stress relieved prior to heating to a preheat temperature.

39. A process chamber component for use in a process chamber, comprising:
- a body having one or more surfaces; and
- a plurality of features formed on the surfaces, wherein the features have been formed by scanning a beam of electromagnetic energy across a surface of the process chamber component, and wherein the features that are formed are selected from the group consisting of depressions, protuberances, and combinations thereof, and wherein the component is stress relieved after forming the plurality of features.

40. A process chamber component for use in a process chamber, comprising:
- a body having one or more surfaces; and
- a plurality of features formed on the surfaces, wherein the features have been formed by scanning a beam of electromagnetic energy across a surface of the process chamber component, and wherein the features that are formed are selected from the group consisting of depressions, protuberances, and combinations thereof, and wherein the component is stress relieved prior to providing a texture to a surface and after forming the plurality of features on said surface.

41. A process chamber component for use in a process chamber, comprising:
- a body having one or more surfaces; and
- a plurality of features formed on the surfaces, wherein the features have been formed by scanning a beam of electromagnetic energy across a surface of the process chamber component, and wherein the features that are formed are selected from the group consisting of depressions, protuberances, and combinations thereof, and wherein the component is brought to a pre-heat temperature prior to step scanning the electromagnetic beam, and wherein the component is stress relieved after forming the plurality of features.

42. A process chamber component for use in a process chamber, comprising:
- a body having one or more surfaces; and
- a plurality of features formed on the surfaces, wherein the features have been formed by scanning a beam of electromagnetic energy across a surface of the process chamber component, and wherein the features that are formed are selected from the group consisting of depressions, protuberances, and combinations thereof, and wherein the component has features formed on a first and a second surface, wherein the features on the second surface compensate for the induced stress of forming features on the first surface.

43. The method of claim 18, wherein the power density at a point on the surface of the component is in a range of about $10^4$ to about $10^5$ W/mm$^2$.

44. The method of claim 5, wherein chemically roughening the surface comprises electrochemically roughening the surface.

45. The method of claim 22, wherein chemically roughening the surface comprises electrochemically roughening the surface.

46. The process chamber component of claim 35, wherein the surfaces are electrochemically roughened.

* * * * *